US012601802B2

(12) United States Patent
Zhou et al.

(10) Patent No.: US 12,601,802 B2
(45) Date of Patent: Apr. 14, 2026

(54) SYSTEM AND METHOD FOR PRODUCING MAGNETIC RESONANCE IMAGES WITH IN-PLANE SIMULTANEOUS MULTI-SEGMENTS AND FOR PRODUCING 3D MAGNETIC RESONANCE IMAGES WITH REDUCED FIELD-OF-VIEW

(71) Applicant: THE BOARD OF TRUSTEES OF THE UNIVERSITY OF ILLINOIS, Urbana, IL (US)

(72) Inventors: Xiaohong Joe Zhou, Naperville, IL (US); Kaibao Sun, Chicago, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 180 days.

(21) Appl. No.: 18/573,518

(22) PCT Filed: Jun. 27, 2022

(86) PCT No.: PCT/US2022/035187
§ 371 (c)(1),
(2) Date: Dec. 22, 2023

(87) PCT Pub. No.: WO2022/272179
PCT Pub. Date: Dec. 29, 2022

(65) Prior Publication Data
US 2024/0295620 A1 Sep. 5, 2024

Related U.S. Application Data

(60) Provisional application No. 63/214,902, filed on Jun. 25, 2021.

(51) Int. Cl.
*G01R 33/483* (2006.01)
*G01R 33/48* (2006.01)
(Continued)

(52) U.S. Cl.
CPC ..... *G01R 33/4835* (2013.01); *G01R 33/4806* (2013.01); *G01R 33/4822* (2013.01);
(Continued)

(58) Field of Classification Search
CPC ........... G01R 33/4806; G01R 33/4822; G01R 33/4835; G01R 33/4836; G01R 33/5611; G01R 33/5616; G01R 33/56341
See application file for complete search history.

(56) References Cited

U.S. PATENT DOCUMENTS 9,797,970 B2    10/2017 Zhou et al.
9,869,737 B2 *  1/2018 Grinstead .............. G01R 33/50
(Continued)

OTHER PUBLICATIONS

Kaibao Sun et al: "Three-dimensional reduced field-of-view imaging (3D-rFOVI)", Proceedings of the International Society for Magnetic Resonance in Medicine, No. 4193, Apr. 30, 2021 (Apr. 30, 2021), pp. 1-4.
Stefan Posse et al: "Enhancement of temporal resolution and BOLD sensitivity in real-time fMRI using multi-slab echo-volumar imaging", Neuroimage, Elsevier, Amsterdam, NL, vol. 61, No. 1, Feb. 20, 2012 (Feb. 20, 2012), pp. 115-130.
(Continued)

*Primary Examiner* — Gregory H Curran
(74) *Attorney, Agent, or Firm* — GrowIP Law Group LLC

(57) ABSTRACT

The present disclosure provides technologies that allow reduced field of view or fast imaging with reduced image distortion. The first technique capitalizes on the benefit of reduced field of view imaging for full field of view coverage. The second technique allows achieves high resolution 3D images in a focused region. These techniques are expected to have applications for cancer imaging, neuro imaging, and other biomedical imaging areas.

19 Claims, 9 Drawing Sheets

(51) Int. Cl.
G01R 33/561 (2006.01)
G01R 33/563 (2006.01)

(52) U.S. Cl.
CPC ...... G01R 33/4836 (2013.01); G01R 33/5611 (2013.01); G01R 33/5616 (2013.01); G01R 33/56341 (2013.01)

(56) References Cited

U.S. PATENT DOCUMENTS

| | | | | |
|---|---|---|---|---|
| 10,551,457 | B2 * | 2/2020 | Xie ..................... | G01R 33/565 |
| 10,761,168 | B2 * | 9/2020 | Zeller .............. | G01R 33/56563 |
| 2016/0231409 | A1 | 8/2016 | Taviani et al. | |

OTHER PUBLICATIONS

Suchandrima Banerjee et al: "Reduced field-of-view DWI with robust fat suppression and unrestricted slice coverage using tilted 2DRF excitation: rFOV DWI with Tilted 2D RF Excitation", Magnetic Resonance in Medicine, vol. 76, No. 6, Sep. 21, 2016 (Sep. 21, 2016), pp. 1668-1676.

Sunk et al.: "In-plane simultaneous multi-segment imaging: example employing diffusion-weighted imaging using a 2D RF pulse", Proceedings of the International Society for Magnetic Resonance in Medicine, ISMRM & SMRT Virtual Conference & Exhibition, No. 610, Jul. 24, 2020 (Jul. 24, 2020), pp. 1-3.

Written Opinion of the International Search Authority mailed Sep. 30, 2022 for PCT/US22/35187.

\* cited by examiner

Figures 3, 4:
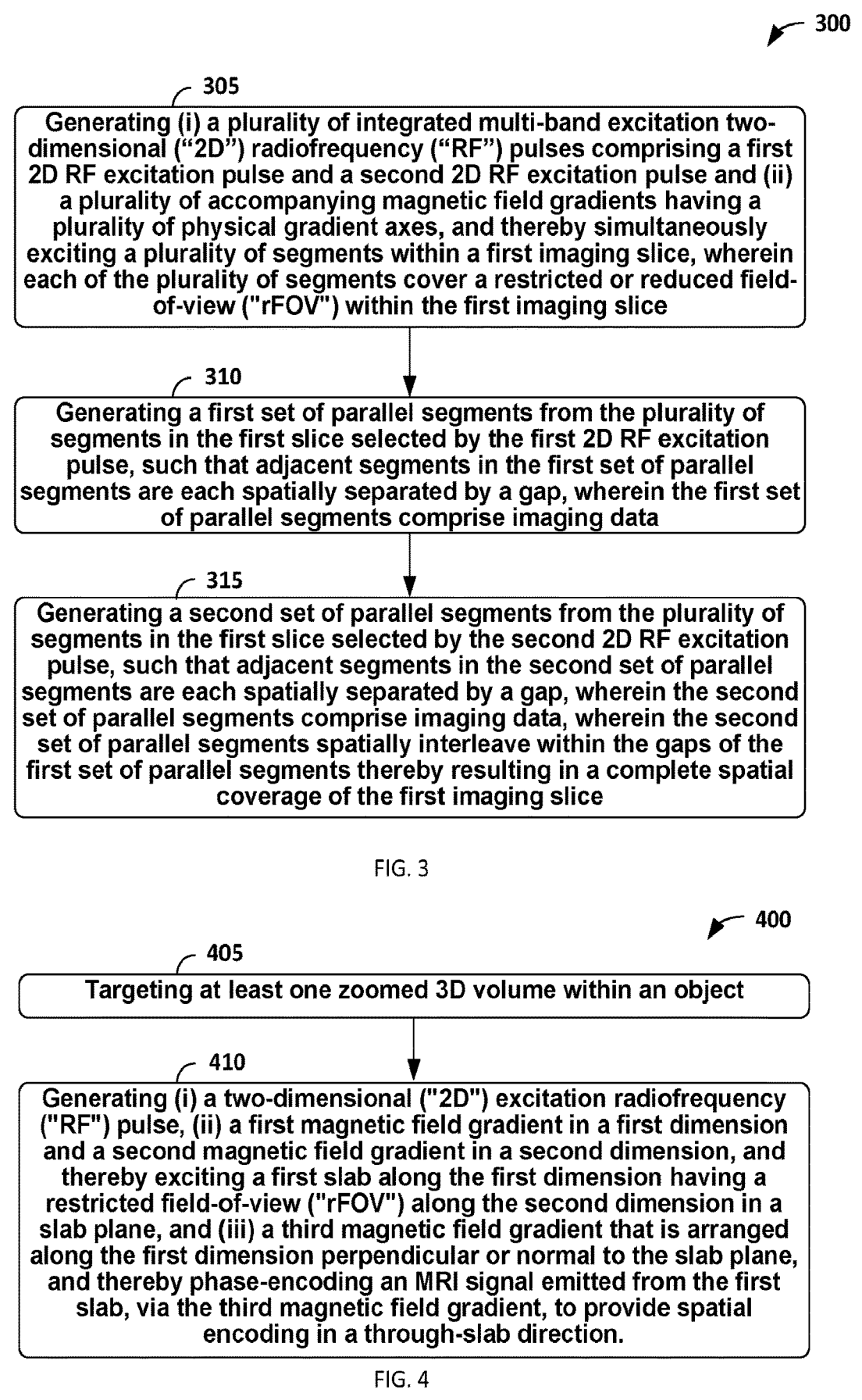

300

305

Generating (i) a plurality of integrated multi-band excitation two-dimensional ("2D") radiofrequency ("RF") pulses comprising a first 2D RF excitation pulse and a second 2D RF excitation pulse and (ii) a plurality of accompanying magnetic field gradients having a plurality of physical gradient axes, and thereby simultaneously exciting a plurality of segments within a first imaging slice, wherein each of the plurality of segments cover a restricted or reduced field-of-view ("rFOV") within the first imaging slice

310

Generating a first set of parallel segments from the plurality of segments in the first slice selected by the first 2D RF excitation pulse, such that adjacent segments in the first set of parallel segments are each spatially separated by a gap, wherein the first set of parallel segments comprise imaging data

315

Generating a second set of parallel segments from the plurality of segments in the first slice selected by the second 2D RF excitation pulse, such that adjacent segments in the second set of parallel segments are each spatially separated by a gap, wherein the second set of parallel segments comprise imaging data, wherein the second set of parallel segments spatially interleave within the gaps of the first set of parallel segments thereby resulting in a complete spatial coverage of the first imaging slice

Targeting at least one zoomed 3D volume within an object

410

Generating (i) a two-dimensional ("2D") excitation radiofrequency ("RF") pulse, (ii) a first magnetic field gradient in a first dimension and a second magnetic field gradient in a second dimension, and thereby exciting a first slab along the first dimension having a restricted field-of-view ("rFOV") along the second dimension in a slab plane, and (iii) a third magnetic field gradient that is arranged along the first dimension perpendicular or normal to the slab plane, and thereby phase-encoding an MRI signal emitted from the first slab, via the third magnetic field gradient, to provide spatial encoding in a through-slab direction.

(A) 1st acquisition     2nd acquisition (B)

Joint GRAPPA

Combination (C)     (D)

IP-SMS EPI     Conventional EPI

Axial          Sagittal          Coronal (A)
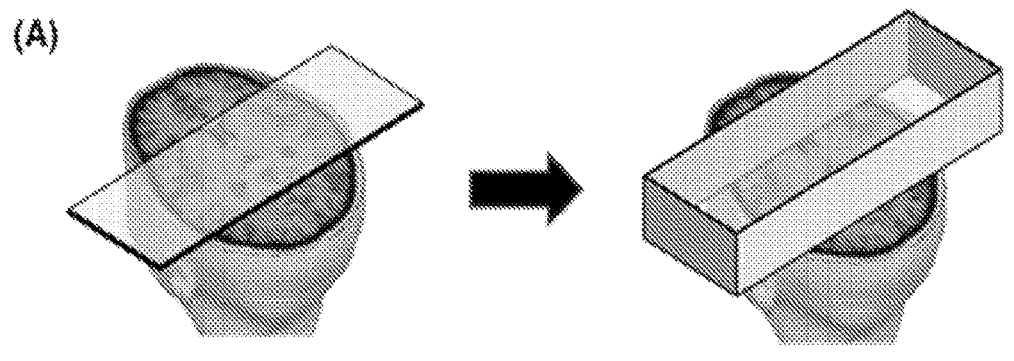
(B)
(C)
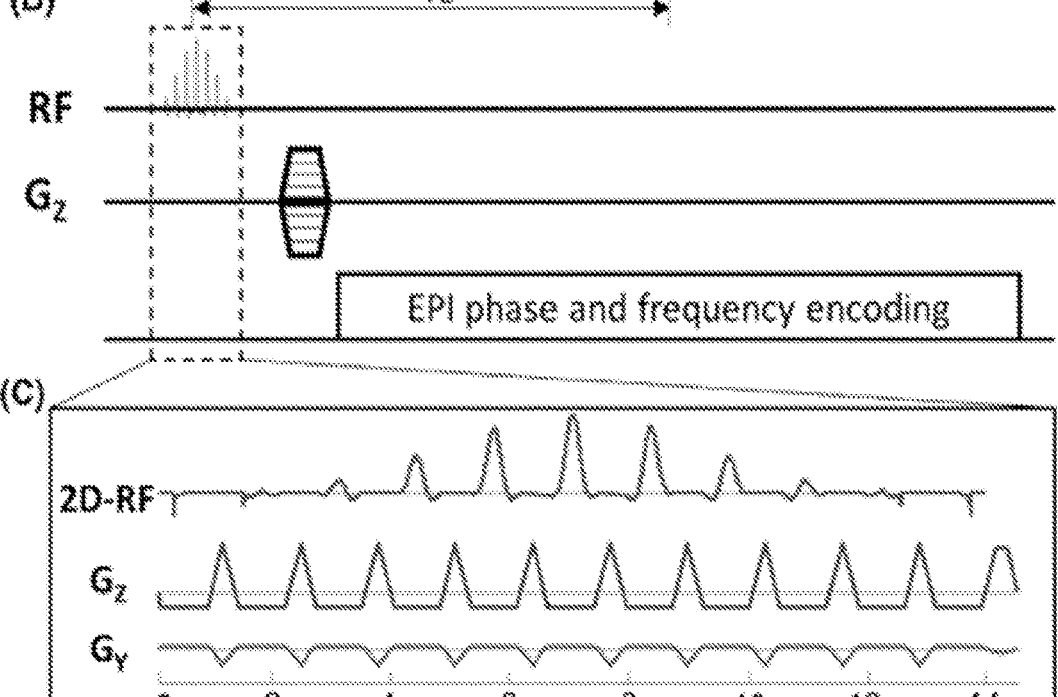
FIG. 12
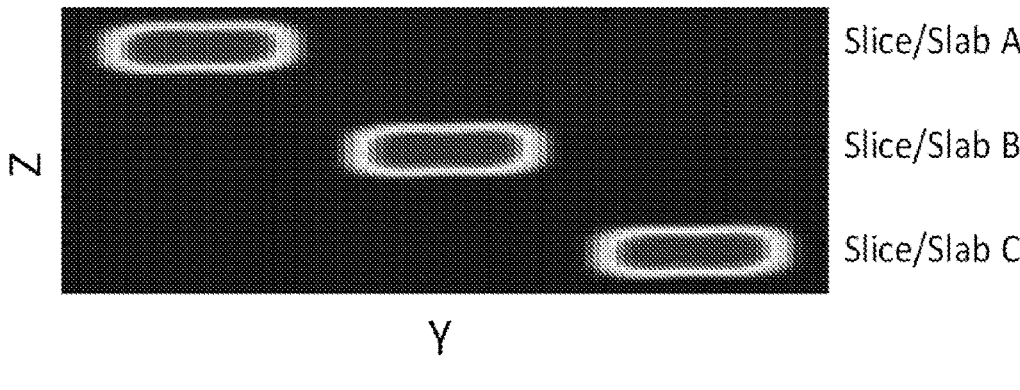
FIG. 17

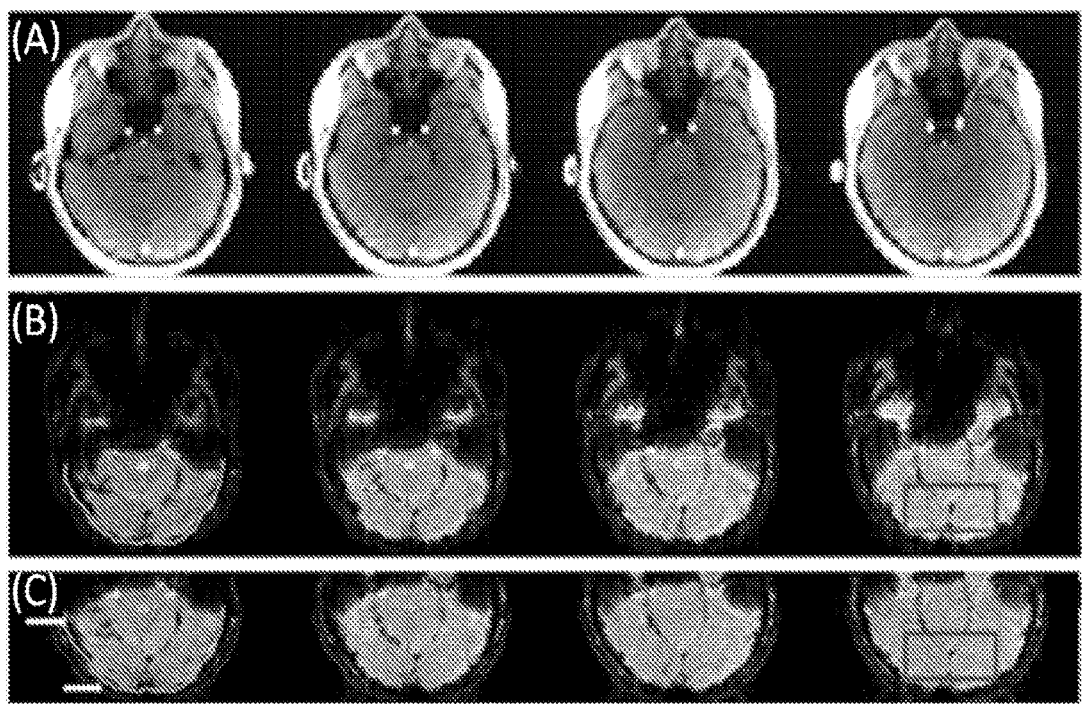
FIG. 14
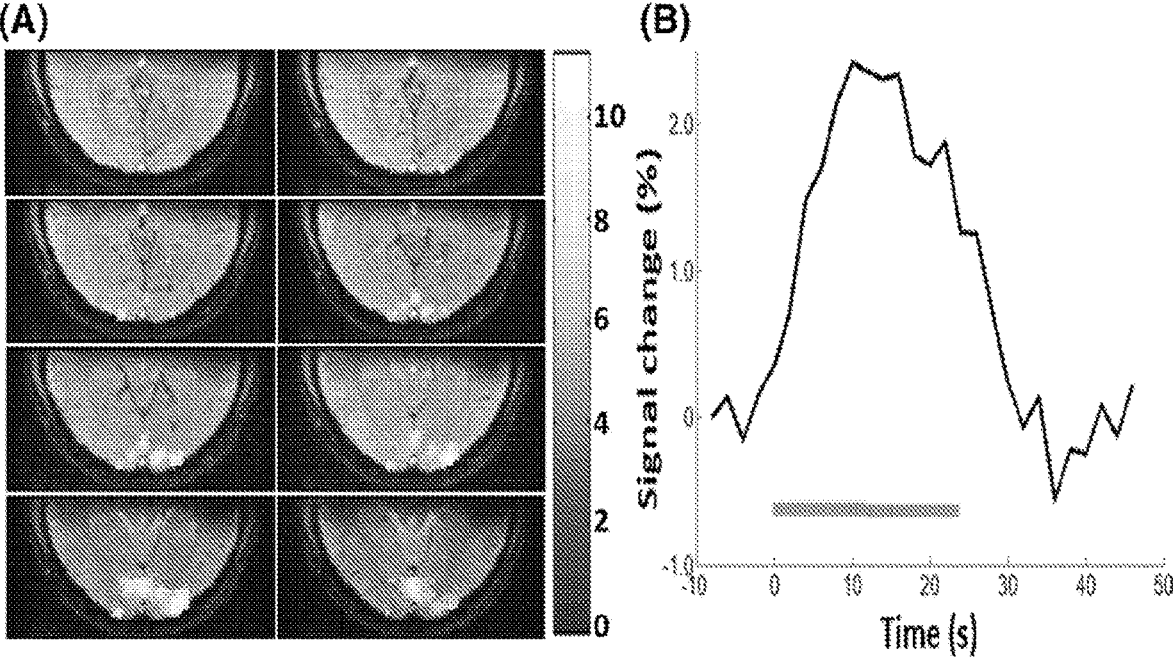
FIG. 15A
FIG. 15B

SYSTEM AND METHOD FOR PRODUCING MAGNETIC RESONANCE IMAGES WITH IN-PLANE SIMULTANEOUS MULTI-SEGMENTS AND FOR PRODUCING 3D MAGNETIC RESONANCE IMAGES WITH REDUCED FIELD-OF-VIEW

CROSS-REFERENCE TO RELATED APPLICATION

This is a U.S. National Phase Application of International PCT Application No. PCT/US22/35187, filed Jun. 27, 2022, that claims the benefit of the filing date of U.S. Provisional Patent Application No. 63/214,902, filed on Jun. 25, 2021, that are each hereby incorporated by reference in their entirety.

STATEMENT OF GOVERNMENT INTEREST

This invention was made with government support under grant nos. 1S10RR028898-01 and 5R01EB026716-01, awarded by the National Institutes of Health. The government has certain rights in this invention.

BACKGROUND

Magnetic resonance ("MR") images are typically acquired with a field-of-view (FOV) that encompasses the imaged object. This approach often results in low spatial resolution and increases image distortion, particularly when fast imaging techniques such as echo planar imaging ("EPI") are used. To mitigate image distortion while achieving a high spatial resolution, magnetic resonance imaging (MRI) methods with a reduced FOV ("rFOV") have been proposed. The rFOV approach enables a number of applications where imaging of a focal region within a larger object is desired. Examples include visualizing the prostate gland in the pelvis for cancer detection, zooming into the brainstem to study neuro-degenerative changes associated with Parkinson's disease, imaging the heart without the perturbing chest wall, etc.

Existing rFOV techniques are typically developed for 2D multi-slice imaging, which uses a 2D radiofrequency ("RF") pulse to select a slice and simultaneously limit the FOV within the selected slice. This approach limits the slice thickness to a few millimeters (e.g., 3-5 mm) due to constraints imposed to the RF pulse and the associated gradients in an MRI system. In some applications, 3D imaging, instead of 2D multi-slice imaging, is preferred to visualize fine anatomic details with much thinner slices. In other applications, a full 2D FOV coverage is desirable while still retaining the benefits (e.g., reduced image distortion and high spatial resolution) of rFOV imaging.

SUMMARY

The disclosure sets forth two distinct MRI techniques. The techniques enable systems to achieve either (a) full FOV 2D imaging by using simultaneously acquired multiple segments within a 2D imaging plane, followed by tiling the segments together to form an image over the full FOV, or (b) 3D rFOV imaging by exciting a slab with a limited in-slab FOV, followed by spatial encoding along the through-slab direction. The first technique is referred to hereinbelow as "in-plane simultaneous multi-segment (IP-SMS)" imaging, and the second technique is referred to hereinbelow as "3D reduced field-of-view imaging (3D-rFOVI)."

In accordance with the principles herein systems and methods are configured to generate a full FOV 2D image from multiple segments, such that each segment is acquired over a reduced FOV and multiple segments are acquired simultaneously using a multi-dimensional RF pulse.

An exemplary MRI system constructed in accordance with the principles herein can include components configured to generate integrated multi-band excitation 2D RF pulses, together with accompanying magnetic field gradients involving a plurality of physical gradient axes, to simultaneously excite multi-segments within a same imaging slice or plane, each said segment covering a restricted field-of-view within the said imaging plane, the system operably integrating all relevant imaging components to produce images with desired image contrast without limitation.

In a first aspect, an example method for using an MRI system electrically coupled to a computing device is disclosed. The method includes (a) generating (i) a plurality of integrated multi-band excitation two-dimensional ("2D") radiofrequency ("RF") pulses including a first 2D RF excitation pulse and a second 2D RF excitation pulse and (ii) a plurality of accompanying magnetic field gradients having a plurality of physical gradient axes, and thereby simultaneously exciting a plurality of segments within a first imaging slice, wherein each of the plurality of segments cover a restricted or reduced field-of-view ("rFOV") within the first imaging slice, (b) generating a first set of parallel segments from the plurality of segments in the first slice selected by the first 2D RF excitation pulse, such that adjacent segments in the first set of parallel segments are each spatially separated by a gap, wherein the first set of parallel segments comprise imaging data, and (c) generating a second set of parallel segments from the plurality of segments in the first slice selected by the second 2D RF excitation pulse, such that adjacent segments in the second set of parallel segments are each spatially separated by a gap, wherein the second set of parallel segments comprise imaging data, wherein the second set of parallel segments spatially interleave within the gaps of the first set of parallel segments thereby resulting in a complete spatial coverage of the first imaging slice.

In a second aspect, an example non-transitory computer-readable medium is disclosed. The computer readable medium has stored thereon program instructions that upon execution by a processor, cause performance of a set of steps including (a) an MRI system generating a plurality of integrated multi-band excitation two-dimensional ("2D") radiofrequency ("RF") pulses comprising a first 2D RF excitation pulse and a second 2D RF excitation pulse, together with a plurality of accompanying magnetic field gradients having a plurality of physical gradient axes, thereby simultaneously exciting a plurality of segments within a first imaging slice, where each of the plurality of segments cover a restricted or reduced field-of-view ("rFOV") within the first imaging slice, (b) the MRI system generating a first set of parallel segments from the plurality of segments in the first slice selected by the first 2D RF excitation pulse, such that adjacent segments in the first set of parallel segments are each spatially separated by a gap, where the first set of parallel segments comprise imaging data, and (c) the MRI system generating a second set of parallel segments from the plurality of segments in the first slice selected by the second 2D RF excitation pulse, such that adjacent segments in the second set of parallel segments are each spatially separated by a gap, where the second set of parallel segments comprise imaging data, where the second set of parallel segments spatially interleave within the gaps of the first set of parallel segments thereby resulting in a complete spatial coverage of the first imaging slice.

In a third aspect, an example method for using an MRI system electrically coupled to a computing device is disclosed. The method includes (a) targeting at least one zoomed 3D volume within an object, and (b) generating (i) a 2D excitation radiofrequency (RF) pulse, (ii) a first magnetic field gradient in a first dimension and a second magnetic field gradient in a second dimension, and thereby exciting a first slab along the first dimension having a restricted field-of-view ("rFOV") along the second dimension in a slab plane, and (iii) a third magnetic field gradient that is arranged along the first dimension perpendicular or normal to the slab plane, and thereby phase-encoding an MRI signal emitted from the first slab, via the third magnetic field gradient, to provide spatial encoding in a through-slab direction.

In a fourth aspect, an example non-transitory computer-readable medium is disclosed. The computer readable medium has stored thereon program instructions that upon execution by a processor, cause performance of a set of steps including (a) an MRI system targeting at least one zoomed 3D volume within an object, and (b) the MRI system generating (i) a 2D excitation radiofrequency (RF) pulse, (ii) a first magnetic field gradient in a first dimension and a second magnetic field gradient in a second dimension, and thereby exciting a first slab along the first dimension having a restricted field-of-view ("rFOV") along the second dimension in a slab plane, and (iii) a third magnetic field gradient that is arranged along the first dimension perpendicular or normal to the slab plane, and thereby phase-encoding an MRI signal emitted from the first slab, via the third magnetic field gradient, to provide spatial encoding in a through-slab direction.

The features, functions, and advantages that have been discussed can be achieved independently in various examples or may be combined in yet other examples further details of which can be seen with reference to the following description and drawings.

BRIEF DESCRIPTION OF THE DRAWINGS

FIG. 3 shows a flowchart of a method for using the MRI system, according to an example implementation;

FIG. 4 shows a flowchart of a method for using the MRI system, according to an example implementation;

FIG. 12 shows a schematic in section A illustrating 3D rFOVI by replacing slice selection with slab selection using a 2D RF pulse shown in section C, followed by through-slab phase-encoding as shown in section B. Section B further shows a conceptual 3D rFOVI sequence with phase-encoding gradient along the slab direction. Section C shows details of the 2D RF excitation pulse with a fly-back EPI excitation k-space trajectory to avoid the issues associated with Nyquist ghosts;

FIG. 14 shows four representative contiguous slices selected from 3D datasets of human visual cortex acquired using three different sequences: a 3D SPGR sequence shown in row A, a 3D GRE-EPI with a full FOV shown in row B, and the 3D-rFOV GRE-EPI shown in row C. The contour line in the first column outlines the edge of the brain parenchyma in the SPGR image in row A, and is used as a reference. Compared to the full-FOV images in row B, the images in row C exhibited less image distortion (indicated by arrows). The SNRs measured in the region of visual cortex (framed in the last column) in rows B and C were 117.6 and 81.5, respectively;

FIG. 15A shows eight contiguous visual fMRI activation maps, selected from the 3D volume, overlaid onto the baseline images acquired with 3D-rFOV GRE-EPI;

FIG. 15B shows the time course over 48 s illustrates the activation with a BOLD signal change of approximately 2.5%. The horizontal bar represents the time period for the visual stimulus, which was 24 s;

FIG. 17 shows a tilted excitation profile for a plurality of imaging slices or slabs, according to one example implementation.

Figure 1:
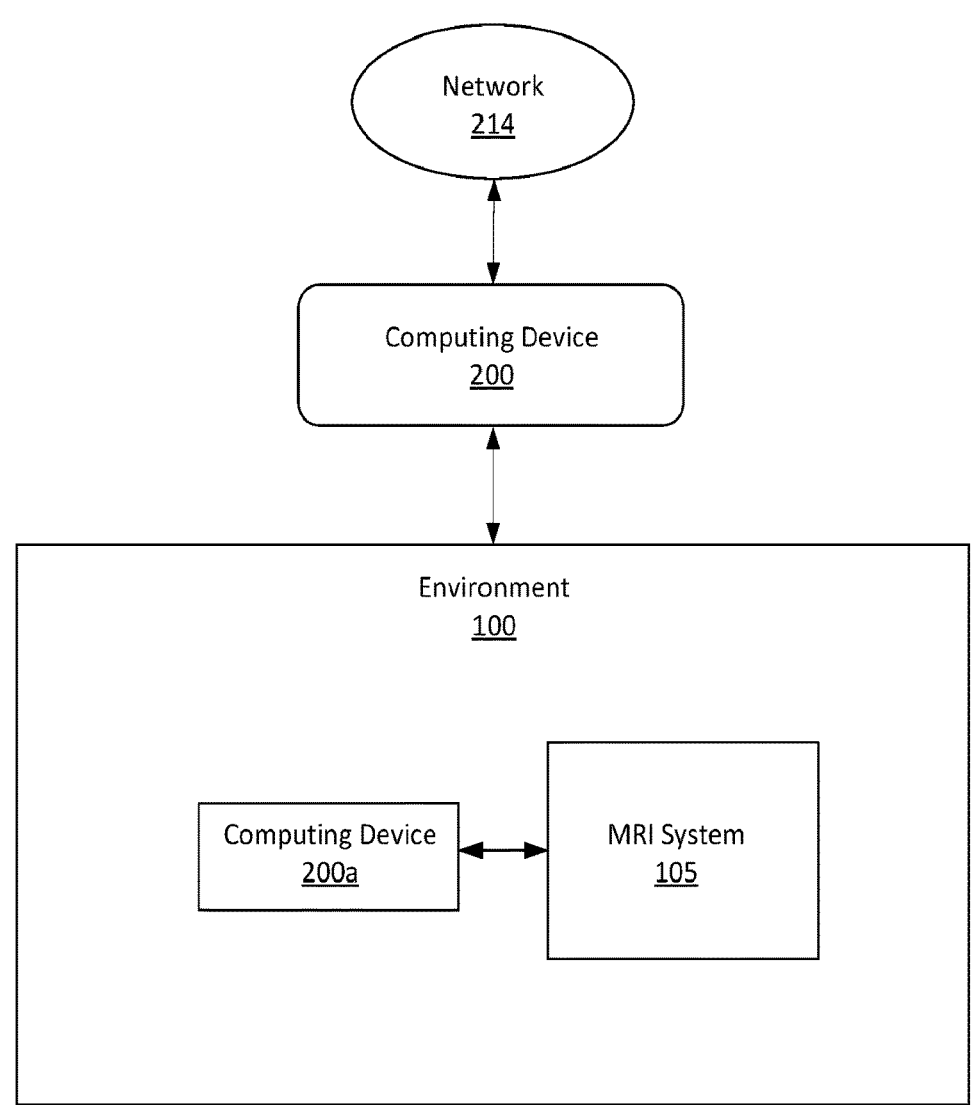
FIG. 1 is a functional block diagram of an MRI system electrically coupled to a computing device, according to one example implementation.

The drawings are for the purpose of illustrating examples, but it is understood that the inventions are not limited to the arrangements and instrumentalities shown in the drawings

DETAILED DESCRIPTION

I. Overview

The disclosed examples provide "in-plane simultaneous multi-segment (IP-SMS)" imaging that produces a full FOV image consisting of multiple segments, each with a reduced FOV, to leverage the benefits of rFOV imaging while achieving a full FOV coverage. Herein, MRI systems and methods can be configured to simultaneously acquire multiple in-plane segments to form a full FOV image without lengthening the imaging times. IP-SMS complements the existing "through-plane simultaneous multi-slice" imaging that is presently under commercialization.

MRI is typically of low spatial resolution. Efforts to increase the spatial resolution leads to much longer scan times when a full FOV coverage is desired. By simultaneously acquiring multiple spatial segments, each with a reduced FOV but all within the same imaging plane, the disclosed method can achieve high spatial resolution over a full FOV without lengthening the imaging times, while reducing image distortion. These features can benefit a host of MRI applications from clinical patient care to research.

II. Example Architecture

FIG. 1 is a block diagram showing an operating environment 100 that includes or involves, for example, an MRI system 105 described below. Methods 300 and 400 in FIGS. 3-4 described below show embodiments of methods that can be implemented within this operating environment 100.

Figure 2:
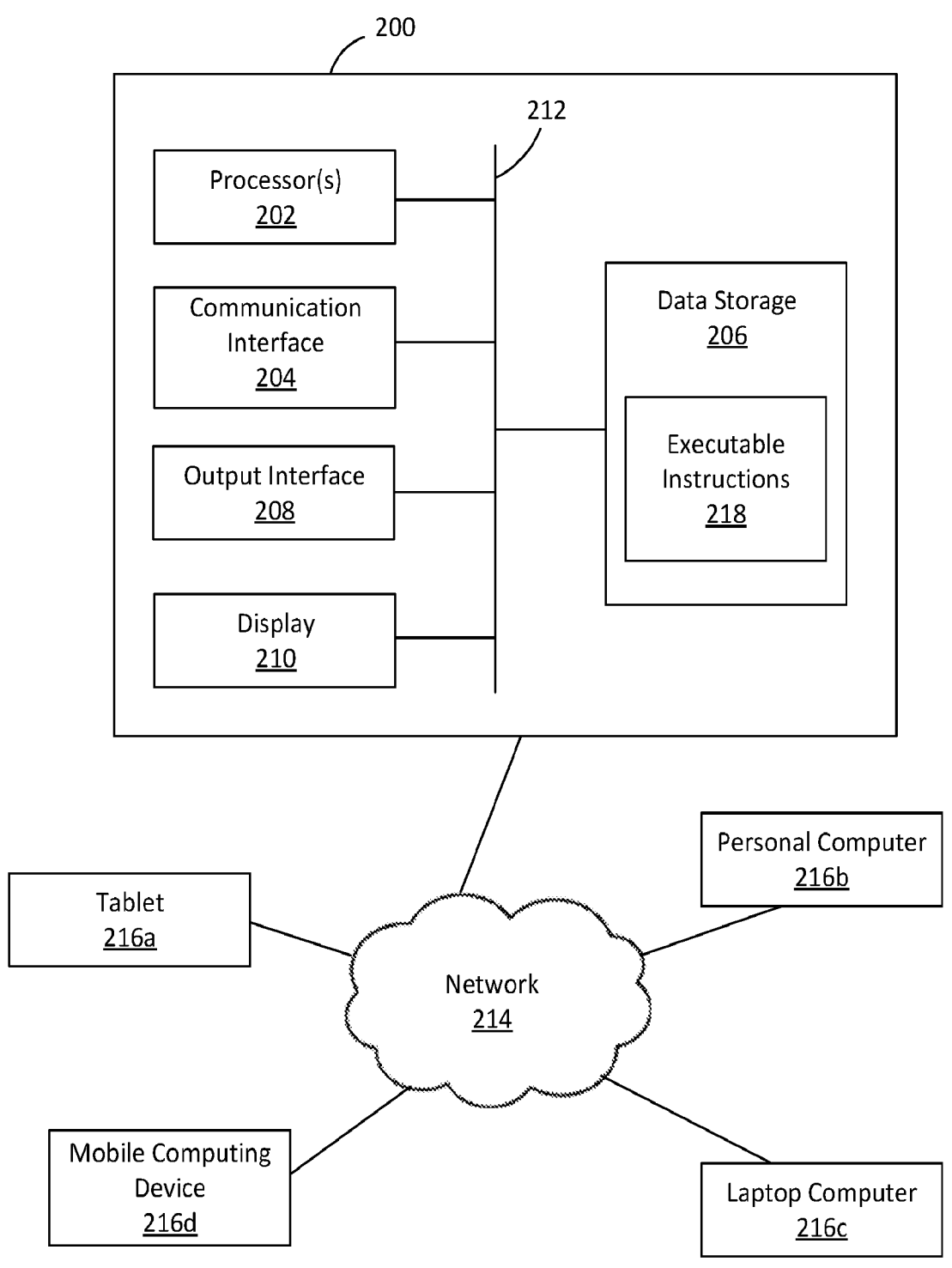
FIG. 2 depicts a block diagram of a computing device and a computer network, according to an example implementation.

FIG. 2 is a block diagram illustrating an example of a computing device 200, according to an example implementation, that is configured to interface with operating environment 100, either directly or indirectly. The computing device 200 may be used to perform functions of the methods shown in FIGS. 3-4 and described below. In particular, computing device 200 can be configured to perform one or more functions, including reconstructing an image of a portion of or a full field-of-view ("FOV") of one or more imaging slices and/or reconstructing a phase-encoded MRI signal to form a 3D image for one or more slabs, for example. The computing device 200 has a processor(s) 202, and also a communication interface 204, data storage 206, an output interface 208, and a display 210 each connected to a communication bus 212. The computing device 200 may also include hardware to enable communication within the computing device 200 and between the computing device 200 and other devices (e.g., not shown). The hardware may include transmitters, receivers, and antennas, for example.

The communication interface 204 may be a wireless interface and/or one or more wired interfaces that allow for both short-range communication and long-range communication to one or more networks 214 or to one or more remote computing devices 216 (e.g., a tablet 216*a*, a personal computer 216*b*, a laptop computer 216*c* and a mobile computing device 216*d*, for example). Such wireless interfaces may provide for communication under one or more wireless communication protocols, such as Bluetooth, Wi-Fi (e.g., an institute of electrical and electronic engineers (IEEE) 802.11 protocol), Long-Term Evolution (LTE), cellular communications, near-field communication (NFC), and/or other wireless communication protocols. Such wired interfaces may include Ethernet interface, a Universal Serial Bus (USB) interface, or similar interface to communicate via a wire, a twisted pair of wires, a coaxial cable, an optical link, a fiber-optic link, or other physical connection to a wired network. Thus, the communication interface 204 may be configured to receive input data from one or more devices and may also be configured to send output data to other devices.

The communication interface 204 may also include a user-input device, such as a keyboard, a keypad, a touch screen, a touch pad, a computer mouse, a track ball and/or other similar devices, for example.

The data storage 206 may include or take the form of one or more computer-readable storage media that can be read or accessed by the processor(s) 202. The computer-readable storage media can include volatile and/or non-volatile storage components, such as optical, magnetic, organic or other memory or disc storage, which can be integrated in whole or in part with the processor(s) 202. The data storage 206 is considered non-transitory computer readable media. In some examples, the data storage 206 can be implemented using a single physical device (e.g., one optical, magnetic, organic or other memory or disc storage unit), while in other examples, the data storage 206 can be implemented using two or more physical devices.

The data storage 206 thus is a non-transitory computer readable storage medium, and executable instructions 218 are stored thereon. The instructions 218 include computer executable code. When the instructions 218 are executed by the processor(s) 202, the processor(s) 202 are caused to perform functions.

The processor(s) 202 may be a general-purpose processor or a special purpose processor (e.g., digital signal processors, application specific integrated circuits, etc.). The processor(s) 202 may receive inputs from the communication interface 204 and process the inputs to generate outputs that are stored in the data storage 206 and output to the display 210. The processor(s) 202 can be configured to execute the executable instructions 218 (e.g., computer-readable program instructions) that are stored in the data storage 206 and are executable to provide the functionality of the computing device 200 described herein.

The output interface 208 outputs information to the display 210 or to other components as well. Thus, the output interface 208 may be similar to the communication interface 204 and can be a wireless interface (e.g., transmitter) or a wired interface as well. The output interface 208 may send commands to one or more controllable devices, for example.

The computing device 200 shown in FIG. 2 may also be representative of a local computing device 200a in operating environment 100, for example, in communication with and electrically coupled to the MRI system 105. This local computing device 200a may perform one or more of the steps of the methods 300 and 400 described below, may receive input from a user and/or may send image data and user input to computing device 200 to perform all or some of the steps of methods 300 and 400.

FIGS. 3 and 4 show flowcharts of example methods 300 and 400 to obtain imaging data for multiple sets of parallel segments of an imaging slice and spatially encode one or more slabs and acquire k-space data for image reconstruction, according to an example implementation. Methods 300 and 400 are example methods that could be used with the computing device 200 of FIG. 2, for example. In some instances, components of MRI system 105 may be configured to perform the functions such that the components are configured and structured with hardware and/or software to enable such performance. Components of the devices and/or systems may be arranged to be adapted to, capable of, or suited for performing the functions, such as when operated in a specific manner. Methods 300 and 400 may include one or more operations, functions, or actions as illustrated by one or more of blocks 305-315 and blocks 405-410, respectively. Although the blocks are illustrated in a sequential order, some of these blocks may also be performed in parallel, and/or in a different order than those described herein. Also, the various blocks may be combined into fewer blocks, divided into additional blocks, and/or removed based upon the desired implementation.

It should be understood that for this and other processes and methods disclosed herein, flowcharts show functionality and operation of one possible implementation of the present examples. In this regard, each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. Further, the program code can be encoded on a computer-readable storage media in a machine-readable format, or on other non-transitory media or articles of manufacture. The computer readable medium may include non-transitory computer readable medium or memory, for example, such as computer-readable media that stores data for short periods of time such as register memory, processor cache and Random Access Memory (RAM). The computer readable medium may also include non-transitory media, such as secondary or persistent long-term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block in FIGS. 3 and 4, and within other processes and methods disclosed herein, may represent circuitry that is wired to perform the specific logical functions in the process. Alternative implementations are included within the scope of the examples of the present disclosure in which functions may be executed out of order from that shown or discussed, including substantially concurrent or in reverse order, depending on the functionality involved, as would be understood by those reasonably skilled in the art.

III. Example Methods

The following methods 300 and 400 may include one or more operations, functions, or actions as illustrated by one or more of blocks 305-315 and 405-410. Although the blocks are illustrated in a sequential order, these blocks may also be performed in parallel, and/or in a different order than those described herein. Also, the various blocks may be combined into fewer blocks, divided into additional blocks, and/or removed based upon the desired implementation. Alternative implementations are included within the scope of the examples of the present disclosure in which functions may be executed out of order from that shown or discussed, including substantially concurrent or in reverse order, depending on the functionality involved, as would be understood by those reasonably skilled in the art.

Referring now to FIG. 3, FIG. 3 shows a flowchart of an example method 300 for using the MRI system 105 electrically coupled to a computing device 200, according to an example implementation. As used herein, "electrically coupled" refers to coupling using a conductor, such as a wire or a conductible trace, as well as inductive, magnetic, and wireless couplings. The computing device 200 may be local or remote to the MRI system.

Method 300 includes, at block 305, the MRI system 105 generates (i) a plurality of integrated multi-band excitation two-dimensional ("2D") radiofrequency ("RF") pulses comprising a first 2D RF excitation pulse and a second 2D RF excitation pulse and (ii) a plurality of accompanying magnetic field gradients having a plurality of physical gradient axes, and thereby simultaneously exciting a plurality of segments within a first imaging slice. Each of the plurality of segments cover a restricted or reduced field-of-view ("FOV") within the first imaging slice. Then, at block 310, the MRI system 105 generates a first set of parallel segments from the plurality of segments in the first slice selected by the first 2D RF excitation pulse, such that adjacent segments in the first set of parallel segments are each spatially separated by a gap. The first set of parallel segments comprise imaging data. Next, at block 315, the MRI system 105 generates a second set of parallel segments from the plurality of segments in the first slice selected by the second 2D RF excitation pulse, such that adjacent segments in the second set of parallel segments are each spatially separated by a gap. The second set of parallel segments comprise imaging data. The second set of parallel segments spatially interleave within the gaps of the first set of parallel segments thereby resulting in a complete spatial coverage of the first imaging slice. In other words, the center of each of the second set of parallel segments will be positioned within the center of the gaps of the first set of parallel segments.

After completing imaging of the first slice, or concurrent with imaging of the first slice, second, third, fourth, etc. slices can be imaged using the same procedure. In addition, multiple sets of parallel segments may also be utilized in optional embodiments (e.g., third, fourth, and fifth sets of parallel segments).

In one optional implementation, method 300 further includes the computing device reconstructing an image of a portion of or a full field-of-view ("FOV") of the first imaging slice based on the imaging data of the first set of parallel segments and the imaging data of the second set of parallel segments. In an optional implementation, a portion of a FOV may be desired, for example, if a tumor is only in one hemisphere of the brain. Unlike conventional simultaneous multi-slice (SMS) imaging where multiple slices within a volume are simultaneously excited, method 300 is directed to IP-SMS that excites multiple segments (or bands) within an imaging slice using a 2D RF excitation pulse. As disclosed, these segments are separately reconstructed and combined to form a final image of a slice. In doing so, the final image may have the complete benefits (e.g., high resolution and reduced image distortion) of rFOV imaging without the lengthy scan times of acquiring the individual segments sequentially as in iSeg-EPI.

Figure 7:
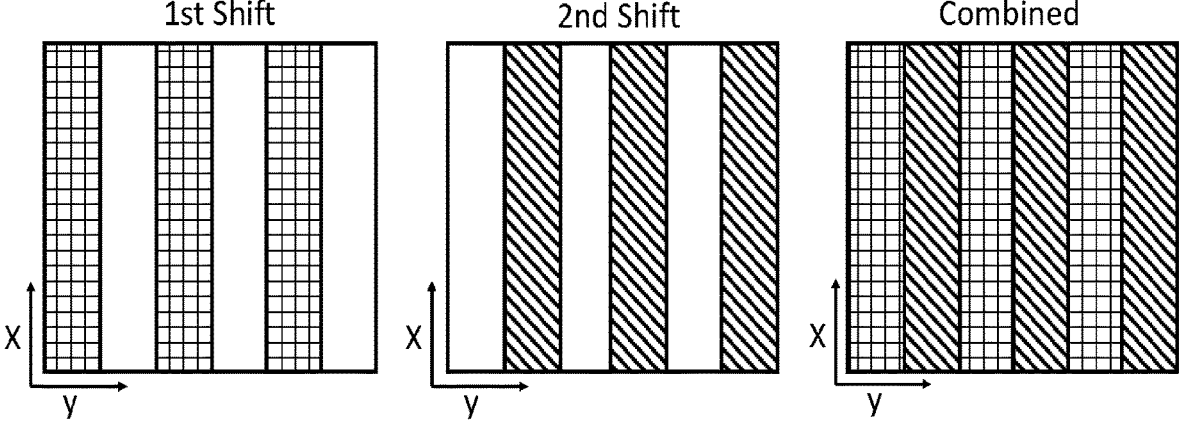
FIG. 7 shows multiple parallel segments excited in two different shifts (or sets of segments) that are complementary and configured to be combined to cover the prescribed full field of view (FOV). The outer square frame represents the FOV in the x-y plane. Bands shown in the first shift and the second shift represent the simultaneously excited segments from different shifts. The spatially localized selectivity dictated by the multi-segment excitation profile can be used in conjunction with the spatial sensitivity of multichannel or multi-element receiving coils in GRAPPA reconstruction, according to an example implementation.

In operation, a targeted field of view for an image is identified and divided into the plurality of parallel segments. In one implementation, an operator of the MRI system 105 or the computing device 200 may identify the targeted imaging slice, including the location, orientation, and thickness, as well as the set of slices necessary to cover a region of interest (e.g., a tumor). The 2D RF pulses have excitation bands periodically distributed in a phase-encoding direction. These bands from a plurality of 2D RF pulses complement each other to adequately cover the targeted field of view. k-space data acquisition can be accomplished using either conventional sampling or accelerated with parallel imaging. With reference to FIG. 7, the first set of parallel segments (Shift 1) are excited by the 2D RF pulse in the phase-encoding direction (y-direction) and k-space data is acquired. The second set of parallel segments (Shift 2) are excited by the 2D RF pulse in the phase-encoding direction and k-space data with the same acceleration factor as Shift 1 is acquired. The k-space data for the first and second sets of parallel segments from the two shifts is reconstructed by the computing device 200. And the composite spatial excitation patterns, (i.e., by joining the two or more sets of spatial response functions of the 2D RF pulses) are exploited to enhance the spatial sensitivity profile for parallel image reconstruction. The result is an MR image having the targeted field of view. This combined MR image and its corresponding k-space data may be stored locally in data storage 206 or sent to another computing device 216*a-d* in the network 214.

In one optional implementation, the MRI system has a plurality of physical receiving RF coils and a plurality of virtual coils. In this implementation, method 300 further includes the computing device determining a plurality of sensitivity profiles that correspond to each of the plurality of physical receiving RF coils and the plurality of virtual coils. There are three types of sensitivity profiles: (a) sensitivity profile of the physical receiving RF coil, (b) sensitivity profile associated with the 2D RF pulse, and (c) sensitivity profile of the virtual coil, which is based on the combination of (a) and (b). Method 300 then includes the computing device 200 determining the gaps for spatial separation in the first set of parallel segments and in the second set of parallel segments based on the 2D RF pulse design. In other words, the computing device 200 spatially separates the simultaneously acquired parallel segments. In one optional implementation, the first set of parallel segments and the second set of parallel segments are spatially encoded using an echo planar imaging method. In addition, method 300 further includes reconstructing an image of a full field-of-view ("FOV") of the first imaging slice is further based on the plurality of virtual coil sensitivity profiles comprising the physical receiving RF coil and computed 2D RF excitation profiles that act as a weighting function, as discussed in Example 1 below.

In one optional implementation, method 300 further includes determining a total number of virtual coils based on a total number of the physical coils multiplied by a total number of the plurality of integrated multi-band excitation 2D radiofrequency ("RF") pulses. Then the virtual coils are formed based on a combination of the plurality of sensitivity profiles that correspond to each of the plurality of physical receiving RF coils sensitivity profiles and a plurality of 2D RF-pulse spatial profiles for each of the plurality of integrated multi-band excitation 2D RF pulses. The 2D RF-pulse spatial profiles may be obtained by solving the Bloch equations or by physical experimental measurements.

Figure 5:
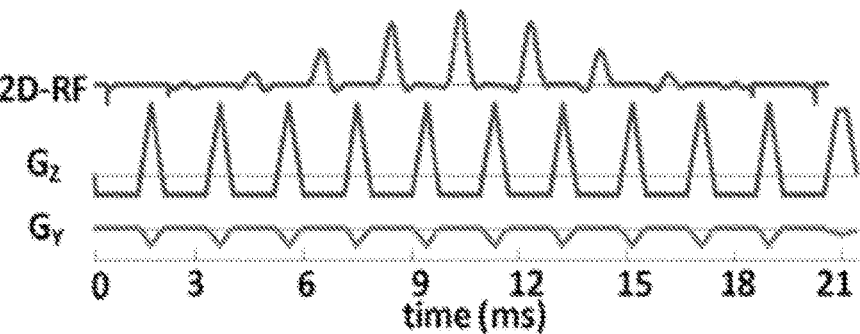
FIG. 5 shows a diagram of a 2D-RF pulse. The 2D-RF pulse uses a fly-back EPI design to avoid the Nyquist ghosts, according to one example implementation.
Figure 6:
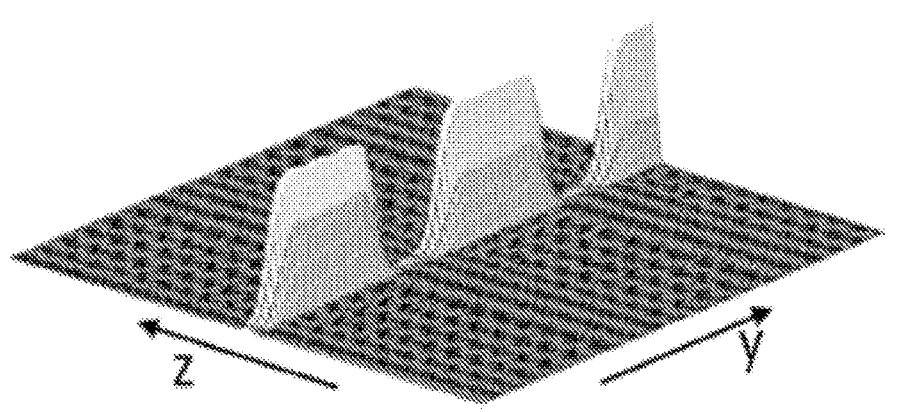
FIG. 6 shows a diagram of the spatial response of the 2D-RF pulse in FIG. 5 in the (y, z) plane, where y and z represent the phase-encoded direction and slice-selection direction, respectively. The replicates simultaneously excite multiple in-plane segments along the y-direction, which are used in in-plane simultaneous multi-segment (IP-SMS) imaging, according to one example implementation.

In another optional implementation, method 300 further includes the plurality of the accompanying magnetic field gradients producing an excitation k-space trajectory using a bipolar or a fly-back echo planar trajectory design. Discrete sampling of excitation k-space along the blipped direction resulted in periodic replicates of the excitation profile (FIGS. 5-6).

As illustrated in FIG. 7, the spatially localized patterns in different shifts (e.g., Shift 1 and Shift 2) can complement sensitivity maps or profiles produced by physical receiving coils of the MRI system 105. Thus, the total number of "virtual" coils is $N_c \times N_s$ (where $N_c$ is the number of physical receiving coils and $N_s$ is the number of shifts necessary to sweep the prescribed full FOV). The multiplied sensitivity profiles can be employed to reconstruct the individual segments using GRAPPA, as discussed in Example 1 below. After all segments are reconstructed, the magnitudes of all segments are combined. as shown in FIG. 7. to form the full-FOV image using the simulated 2D RF excitation profile as a weighting function.

In one optional implementation, method 300 further includes the MRI system 105 applying a gradient $G_y$ during the second RF excitation pulse and thereby modulating a frequency of the second RF excitation pulse and shifting a 2D excitation profile along a phase-encoded direction. As discussed above, complete coverage of full FOV is obtained by shifting the 2D excitation pattern. The shift is accomplished by frequency selectivity based on a small $G_y$ gradient during the sub-pulse. The slight tilt in the resultant side bands has been demonstrated as negligible in comparison with slice thickness (~5%). The 2D RF pulse has been implemented in a diffusion-weighted (DW) single-shot (ss) EPI pulse sequence for experimental demonstration In operation, fat suppression was achieved by a frequency-selective saturation pulse preceding the 2D RF pulse.

In an alternative implementation, method 300 includes the plurality of the accompanying magnetic field gradients producing an excitation k-space trajectory using a tilted excitation k-space design for multi-slice imaging.

In one optional implementation, a width of the gaps that spatially separate the adjacent segments in the first set of parallel segments and the second set of parallel segments ranges from 60% to 90% of a width of each of the segments in the first set of parallel segments and the second set of parallel segments. In a further optional implementation, the width of the gaps that spatially separate the adjacent segments in the first set of parallel segments and the second set of parallel segments is 66% of a width of each of the segments in the first set of parallel segments and the second set of parallel segments.

In another optional implementation, an overlap between the second set of parallel and the first set of parallel segments, when they are interleaved, ranges from 15% to 25% of a width of each of the segments in the first set of parallel segments and the second set of parallel segments. In a further optional implementation, the overlap between the second set of parallel and the first set of parallel segments, when they are interleaved, is 17% of a width of each of the segments in the first set of parallel segments and the second set of parallel segments. The overlap with an adjacent segment occurs in the phase-encoding direction and may be predetermined prior to the 2D RF pulse being generated.

In an alternative implementation, the method 300 may be applied across a plurality of imaging slices with a distributed slice approach rather than using in-plane acquisition within a single imaging slice. Referring to FIG. 17, a set of three segments from a first 2D RF excitation are distributed into three imaging slices A, B, and C. The segment in slice B corresponds to the central segment and the segments in slices A and C correspond to the side segments. In a second 2D RF excitation, a new set of three segments are placed in the locations of the imaging slices that have not been substantially occupied by the previous set of three segments from the first 2D RF excitation. Their positions can be distributed along both dimensions shown in FIG. 17. Subsequent 2D RF excitations will cover the previously uncovered spatial locations within the intended spatial extent in each imaging slice and for all intended slices.

The present disclosure demonstrates that the conventional SMS concept can be extended to in-plane multi-segment imaging. This allows the use of rFOV imaging to cover a full FOV with the benefits of high spatial resolution and reduced image distortion. The proposed IP-SMS technique takes advantage of periodic replicates of the excitation profile of 2D RF pulse, "virtual" coil sensitivity maps or profiles, and image combination with known weighting functions from the Bloch simulations. The virtual coil spatial profile is the combination of the physical receiving RF coils spatial profile and 2D RF pulse spatial profile. The IP-SMS sequence, that does not escalate SAR and is not subject to the slice limitations as in other competing sequences, may be further extended to other applications beyond diffusion imaging.

As discussed above, a non-transitory computer-readable medium having stored thereon program instructions that upon execution by an MRI system 105 electrically coupled to a computing device 200 may be utilized to cause performance of any of functions of the foregoing methods.

As one example, a non-transitory computer-readable medium having stored thereon program instructions that upon execution by a computing device, cause performance of a set of steps includes an MRI system 105 generating a plurality of integrated multi-band excitation two-dimensional ("2D") radiofrequency ("RF") pulses comprising a first 2D RF excitation pulse and a second 2D RF excitation pulse, together with a plurality of accompanying magnetic field gradients having a plurality of physical gradient axes, thereby simultaneously exciting a plurality of segments within a first imaging slice. Each of the plurality of segments cover a restricted or reduced field-of-view ("rFOV") within the first imaging slice. The MRI system 105 generates a first set of parallel segments from the plurality of segments in the first slice selected by the first 2D RF excitation pulse, such that adjacent segments in the first set of parallel segments are each spatially separated by a gap. The first set of parallel segments comprise imaging data. And the MRI system generates a second set of parallel segments from the plurality of segments in the first slice selected by the second 2D RF excitation pulse, such that adjacent segments in the second set of parallel segments are each spatially separated by a gap. The second set of parallel segments comprise imaging data. The second set of parallel segments spatially interleave within the gaps of the first set of parallel segments thereby resulting in a complete spatial coverage of the first imaging slice.

Referring now to FIG. 4, FIG. 4 shows a flowchart of an example method 400 for using the MRI system 105 electrically coupled to computing device 200, according to an example implementation. At block 405, method 400 includes the MRI system 105 targeting at least one zoomed 3D volume within an object. Then, at block 410, method 400 includes the MRI system 105 generating (i) a two-dimensional ("2D") excitation radiofrequency ("RF") pulse, (ii) a first magnetic field gradient in a first dimension and a second magnetic field gradient in a second dimension, and thereby exciting a first slab along the first dimension having a restricted field-of-view ("rFOV") along the second dimension in a slab plane, and (iii) a third magnetic field gradient that is arranged along the first dimension perpendicular or normal to the slab plane, and thereby phase-encoding an MRI signal emitted from the first slab, via the third magnetic field gradient, to provide spatial encoding in a through-slab direction. As used herein, the "through-slab direction" is perpendicular or normal to the slab. In one optional implementation, the first slab is spatially encoded in the slab plane using an echo planar imaging method. In another optional implementation, an excitation k-space trajectory is produced by the 2D RF pulse using a bipolar or a fly-back echo planar trajectory design.

A slab is a thicker image section than the imaging slice discussed with respect to method 300. One benefit of using a slab is that it may include the complete object of interest, like a tumor, so the entire brain does not have to be scanned, for example. More than one slab may be used. For example, if a single slab does not cover the entire tumor of interest, a slab adjacent to the first slab may also be imaged.

In one optional implementation, method 400 further includes the computing device 200 reconstructing the phase-encoded MRI signal to form a 3D image for the first slab.

In one optional implementation, method 400 further includes the first magnetic field gradient and the second magnetic field gradient exciting a plurality of parallel slabs, including the first slab. The plurality of parallel slabs are arranged along the through-slab direction. Then, the third magnetic field gradient phase-encodes an MRI signal emitted from each of the plurality of parallel slabs, including the first slab. And the computing device 200 reconstructs the phase-encoded MRI signal to form a 3D image for the plurality of parallel slabs.

In one optional implementation, method 400 includes the first magnetic field gradient and the second magnetic field gradient producing an excitation k-space trajectory using a tilted excitation k-space design. Then the MRI system 105 generates a set of tilted slabs including a main slab and a plurality of side slabs. In one example, the main (or central) slab may be the first slab. In a further optional implementation, method 400 includes the third magnetic field gradient phase-encoding an MRI signal emitted from at least one of the main slab and the plurality of side slabs in the through-slab direction This optional implementation further includes the strategy with untitled k-space design.

In another optional implementation, method 400 includes the MRI system 105 generating a plurality of subsequent 2D excitation RF pulses. A plurality of sets of tilted slabs, each covering an imaged object in areas that have not been excited by previous 2D excitation RF pulses, are excited by the subsequent 2D excitation RF pulses. The third magnetic field gradient phase-encodes an MRI signal emitted from each slab of the plurality of sets of tilted slabs. The computing device 200 individually reconstructs the phase-encoded MRI signal from each slab of the plurality of sets of tilted slabs to form individual 3D images for each slab of the plurality of sets of tilted slabs. In a further optional implementation, the computing device 200 combines the 3D images from the individual reconstructed slabs to form a 3D image with a reduced or a full FOV.

In an alternative implementation, the method 400 may be applied across a plurality of slabs with a distributed slice approach rather than using in-plane acquisition within a single slab. Referring to FIG. 17, a set of three segments from a first 2D RF excitation are distributed into three slabs A, B, and C. The segment in slab B corresponds to the central segment and the segments in slabs A and C correspond to the side segments. In a second 2D RF excitation, a new set of three segments are placed in the locations of the slabs that have not been substantially occupied by the previous set of three segments from the first 2D RF excitation. Their positions can be distributed along both dimensions shown in FIG. 17. Subsequent 2D RF excitations will cover the previously uncovered spatial locations within the intended spatial extent in each slab and for all intended slabs.

As discussed above, a non-transitory computer-readable medium having stored thereon program instructions that upon execution by an MRI system 105 electrically coupled to a computing device 200 may be utilized to cause performance of any of functions of the foregoing methods.

As one example, a non-transitory computer-readable medium having stored thereon program instructions that upon execution by a computing device, cause performance of a set of steps that includes an MRI system 105 targeting at least one zoomed 3D volume within an object. The MRI system generates (i) a 2D excitation radiofrequency (RF) pulse, (ii) a first magnetic field gradient in a first dimension and a second magnetic field gradient in a second dimension, and thereby exciting a first slab along the first dimension having a restricted field-of-view ("rFOV") along the second dimension in a slab plane, and (iii) a third magnetic field gradient that is arranged along the first dimension perpendicular or normal to the slab plane, and thereby phase-encoding an MRI signal emitted from the first slab, via the third magnetic field gradient, to provide spatial encoding in a through-slab direction.

IV. Example 1-2D In-Plane Simultaneous Multi-Segment Imaging

1. Introduction

Single-shot EPI ("ssEPI") has been used widely in functional imaging, diffusion imaging, and perfusion imaging due to its fast acquisition speed, robustness against motion, and relatively high SNR per unit time. However, ssEPI is subject to geometric distortion caused by various off-resonance effects, such as magnetic susceptibility variations, eddy currents, chemical shifts, concomitant magnetic fields, and bulk Bo-field inhomogeneities. The sensitivity to off-resonance effects is a direct consequence of a narrow sampling bandwidth (e.g., <1 kHz) along the phase-encoded direction. Over the past decades, a number of techniques have been developed to increase the effective phase-encoding bandwidth. For example, the phase-encoding bandwidth can be widened by decreasing the readout sampling points (i.e., shortening echo spacing) as in short axis-PROPELLER EPI and readout-segmented EPI, or by traversing k-space faster along the phase-encoded direction (i.e., increasing $\Delta k_y$) in parallel imaging, multi-shot acquisitions, or reduced FOV (rFOV) imaging. The rFOV approach, however, is not suitable for applications requiring a larger anatomic coverage, such as the whole brain. In a technique known as image-domain segmented EPI (iSeg-EPI), Sui et al demonstrated that a set of parallel, partially overlapping rFOV images, or segments, can be acquired within the same plane and combined to produce a slice with a full-FOV coverage. An obvious disadvantage is the considerably lengthened scan times due to the need to sequentially acquire multiple in-plane segments. Recently, a time-efficient technique was developed in which multiple bands within a plane are simultaneously excited by linearly modulating the phase of the individual subpulses in a 2D-RF pulse. Although this technique considerably shortens the scan times, saturation effects from the side bands of the 2D-RF excitation profile can limit the number of slices per TR. Herein, we report an alternative technique to achieve in-plane simultaneous multi-segment (IP-SMS) imaging without limiting the number of slices. The proposed IP-SMS technique takes advantage of periodic replicates of the spatial profile of a 2D-RF pulse to simultaneously excite and acquire several segments (or bands) within a slice over a rFOV. The simultaneously acquired segments are distributed to their corresponding spatial locations using an algorithm that incorporates GRAPPA-based image reconstruction, and subsequently combined to form a full-FOV image. The IP-SMS technique is demonstrated in DWI on a phantom and healthy human subjects.

2. Methods 2.1 In-Plane Simultaneous Multi-Segment Imaging

A 2D-RF pulse using an EPI-like excitation k-space trajectory produces multiple replicates in its spatial response along the blip-gradient direction (i.e., the y-direction in FIG. 1). Typically, these replicates, or side bands, interfere with the imaging slices or the reduced FOV, and thus must be managed. In IP-SMS, however, the replicates were taken advantage of to excite multiple in-plane segments, as shown in FIG. 1B. Similar to the concept in simultaneous multi-slice imaging, the multiple segments were used to accelerate acquisitions of iSeg-EPI. The gaps between two adjacent segments were chosen as approximately 66% of the width of each segment. To fill in the gaps, a second excitation was used to produce an interleaved set of segments with the proceeding set, with about 17% overlap between the adjacent segments. In each interleave, reduced FOV along the phase-encoded direction led to aliasing of the simultaneously excited segments. The segments were unaliased using joint GRAPPA reconstruction with "virtual coils" (see section 2.4), followed by a combination to form a final image with a full-FOV coverage. In doing so, the final full-FOV image can have the benefits of rFOV imaging (e.g., high resolution and reduced image distortion) without the lengthy scan times needed for acquiring the individual segments sequentially as in iSeg-EPI or the slice limitations as in the study by Taviani et al.

2.2 Radiofrequency Pulse and Pulse-Sequence Design

A 2D-RF pulse (FIG. 5) was designed using a fly-back EPI excitation k-space trajectory to avoid Nyquist ghosts. Eleven subpulses each with a time-bandwidth product of 3.0 were modulated by an envelope pulse whose time-bandwidth product was 6.3 and pulse width was 21.2 ms (FIG. 5). Both the subpulses and the envelope pulse were designed using a Shinnar-Le-Roux algorithm with a linear phase. The concurrent EPI bipolar gradient waveform (ie, $G_z$ gradient in FIG. 5) was designed by minimizing the duration (0.75 ms) of the fly-back (or even) gradient lobes with the maximal slew rate, resulting in a triangular waveform. The odd gradient lobes (each duration=1.25 ms) were stretched to take advantage of the time saved by compressing the even gradient lobes. The corresponding RF pulses were also stretched in pulse width while their amplitudes reduced. The spatial response of the 2D-RF pulse (FIG. 6) was simulated using Bloch equations in MATLAB (MathWorks, Natick, MA). Along the blip-gradient direction (i.e., y-direction), the excitation profile exhibited a FWHM of 5 cm for rFOV imaging and a center-to-center distance of 8.3 cm between two adjacent replicates, both of which were consistent with the 2D-RF pulse design parameters. The replicates were distributed along the phase-encoded direction over a full FOV of 20 cm. To fill in the gaps in between the replicates, a subsequent excitation pulse was frequency-modulated by $\Delta f$ to shift the 2D excitation profile along the phase-encoded direction. This was achieved by applying a small $G_y$ gradient (0.052 mT/m) during the RF pulse in each interleave. The combination of $G_y$ and $\Delta f$ resulted in a spatial shift of $\Delta y = 2\pi \Delta f/(\gamma G_y)$ of the excited segments. For the side bands, the small $G_y$ gradient led to a slight tilt away from the intended slice due to a tilt in the excitation k-space. The tilt angle, however, was designed to be 1°, which had negligible spatial shift of the side bands in the slice-selection direction (i.e., <5% shift compared with the slice thickness). The combination of shifted and unshifted spatial profiles produced a full-FOV coverage with an 8.5-mm (or 17%) overlap between neighboring segments. The 2D-RF pulse was incorporated into a diffusion-weighted EPI pulse sequence for experimental demonstrations.

2.3 Experiments

The diffusion-weighted IP-SMS sequence based on ssEPI was implemented on a GE MR750 3T scanner (GE Healthcare, Waukesha, WI). Experiments on a phantom and healthy human brain were carried out to demonstrate the IP-SMS technique using an eight-channel head coil. For the phantom experiment, a silicone-filled sphere with an inner diameter of 17 cm was used to validate the pulse sequence and its associated image reconstruction. Two interleaves ($N_i$=2) were used with the following parameters: in-plane multiband factor ($N_m$)=3, acquisition FOV=200×50 mm² (i.e., 4-fold undersampling), TR/TE=4000/51.2 ms, matrix size=200×50, voxel size=1×1×5 mm³, $b_{NEX}$=50₂ s/mm², echo spacing=1.028 ms, receiver bandwidth=±250 kHz, and scan time=56 seconds. For comparison, an image was acquired using a conventional ssEPI DWI sequence with a 4-fold acceleration and similar parameters to those listed previously. For the human brain experiment, diffusion-weighted images were acquired in the axial, sagittal, and coronal planes from healthy subjects under an approved protocol by the institutional review board. These images were used to demonstrate the capability of IP-SMS to achieve a high spatial resolution while reducing image distortion. The key acquisition parameters were the same as those in the phantom experiment, except for TR/TE=4000/73.8 ms, $b_{NEX}$=10004 s/mm², and scan time=1 min:44 s. For comparison, images in the same imaging planes were also acquired using a commercial diffusion-weighted ssEPI over a full FOV (200×200 mm²) without (in-plane resolution: 2×2 mm² and 1×1 mm²) and with (in-plane resolution: 1×1 mm²) a 2-fold GRAPPA acceleration. To demonstrate whole-brain coverage without being subject to the limitations imposed by the side bands, another data set was acquired using a total of 20 contiguous slices with two b-values of 50 s/mm² and 1000 s/mm².

2.4 Image Reconstruction

Figure 8:
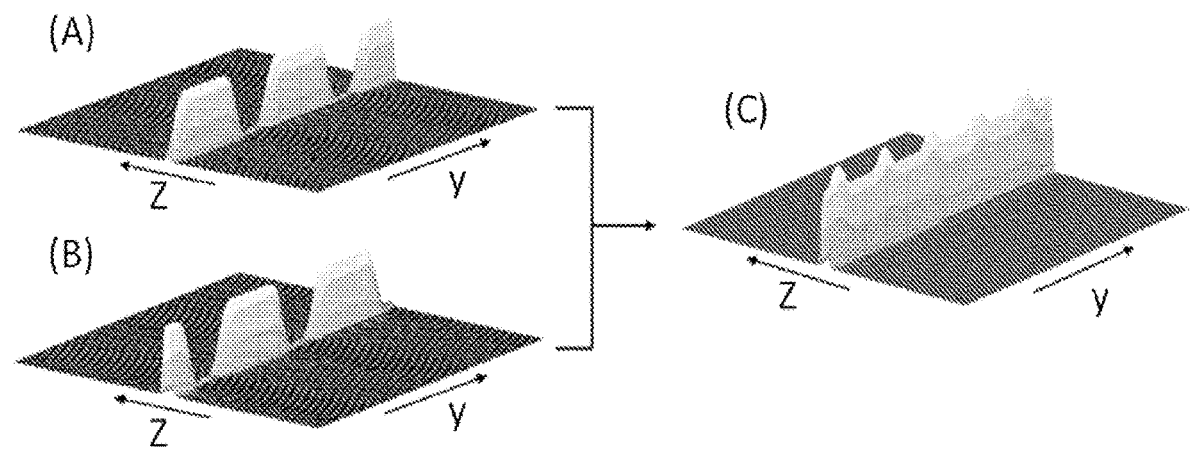
FIG. 8 shows multiple spatial segments excited by two successive 2D-RF pulses (A, B) that are complementary to each other. The combination of segments shown in pulses (A) and (B) adequately covers a desired full FOV shown in (C). The spatial selectivity dictated by the multi-segment excitation profile (i.e., w, in Example 1 below) can be used in conjunction with the spatial sensitivity of multichannel receiving coils in a joint GRAPPA reconstruction. The profile in (C) was obtained by calculating the square root of the sum of squares between pulses (A) and (B), and used as a weighting function in the full-FOV image reconstruction, according to an example implementation.

In image reconstruction, the RF pulse spatial profiles in different interleaves (FIG. 8) were used to form "virtual coils" to complement the sensitivity maps obtained from the physical receiving coil elements. Joint GRAPPA reconstruction (kernel size=6×6, number of autocalibration signal lines=30) with virtual coils was used to improve the image quality, as demonstrated in other studies. 17,23 The sensitivity map of virtual coil v can be expressed as $$S_v = S_p \times P_i$$

where $S_p$ is the sensitivity map of physical coil channel p; and $P_i$ is the excitation profile of interleave i. Thus, the total number of virtual coils is $N_p \times N_i$, where $N_p$ is the number of physical receiving coil channels and $N_i$ is the number of interleaves to sweep the prescribed full FOV. The sensitivity profiles from the $N_p$ physical coil elements and $N_i$ interleaves were obtained experimentally and through Bloch simulations (FIG. 8), respectively, followed by a joint GRAPPA reconstruction of the individual segments from different interleaves. After all segments were reconstructed, the magnitudes of all $N_p \times N_i$ virtual channels were combined to form a full-FOV image by calculating the square root of the sum of squares, as follows:

$$M = \sqrt{\sum_v M_v^2} / \sqrt{\sum_i w_i^2}$$

where $M_v$ is the magnitude image of the vth virtual coil channel; and $w_i$ is the simulated excitation profile of interleave i, which serves as a weighting function (FIG. 8). All images were reconstructed using custom MATLAB programs.

2.5 Data Analysis

To compare the images obtained from IP-SMS and GRAPPA, quantitative metrics were evaluated on the phantom images, including the SNR and RMS error using the fully sampled image as a reference. In addition, to evaluate image nonuniformity associated with the nonideal 2D-RF excitation profile, percent integral uniformity was computed using the definition by the American College of Radiology.

3. Results 3.1 Phantom Experiment

Figure 9:
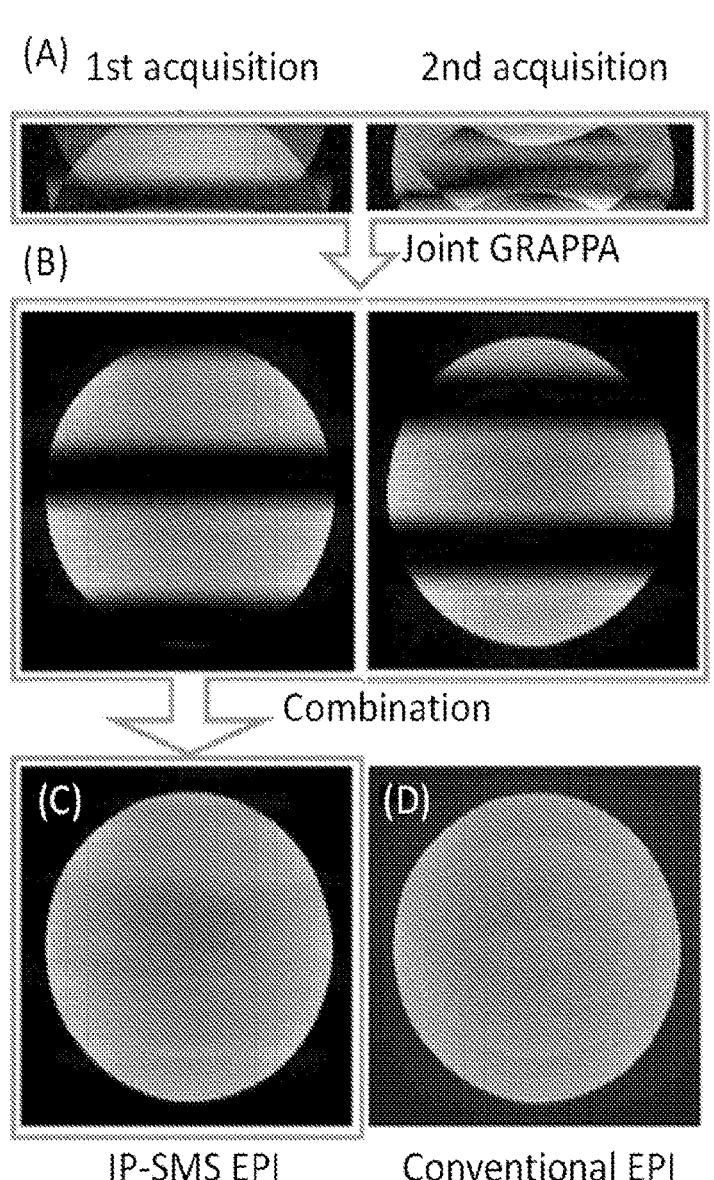
FIG. 9 shows phantom results after each key reconstruction step in IP-SMS. Specifically, section A shows each of the two acquisitions of IP-SMS produced aliased images with a 4-fold undersampling. Section B shows the aliased images were separated using joint GRAPPA reconstruction with 16 virtual coil sensitivity profiles. Section C, shows that after resolving the 4-fold aliasing, the magnitude of all segments from both acquisitions was combined to form the final full-FOV image. Other than minor discontinuity at the boundaries of adjacent segments, no obvious aliasing artifacts were detected in the full-FOV IP-SMS image. And section D shows, in contrast, the image reconstructed from conventional GRAPPA with an acceleration factor of 4 exhibited substantial residual aliasing artifacts.

The results from the phantom experiment are shown in FIG. 9, where the images after each key reconstruction step are displayed. The aliased multiple segments in each of the two acquisitions (FIG. 9, section A), as a result of 4-fold under-sampling, were effectively separated using joint GRAPPA reconstruction with 16 (8 physical receiving coil elements×2 spatial interleaves) virtual-coil sensitivity profiles (FIG. 9, section B). The multiple in-plane segments in the two acquisitions complemented each other, as designed, demonstrating that the strategy of using the frequency modulation to shift the spatial response was effective. The FWHM of each segment was measured at 5.2 cm, and the separation at 3.2 cm, both of which were in good agreement with the designed parameters (5.0 cm and 3.3 cm, respectively). The complementary segments were combined to produce the final full-FOV image as shown in FIG. 9, section C. Other than minor discontinuities at the boundaries of adjacent segments, no obvious aliasing artifacts were detected in the full-FOV image of IP-SMS. In contrast, the image from GRAPPA with an acceleration factor of 4 (FIG. 9, section D) showed obvious residual aliasing artifacts. In comparison with the fully sampled image as a reference, the RMS errors for the two images in FIG. 9, sections C-D were 9.5% and 18.9%, respectively. The IP-SMS approach allowed an aggressive acceleration factor (i.e., 4) without escalating the parallel image reconstruction artifacts. In addition, IP-SMS with a 4-fold undersampling yielded a 23% higher SNR than GRAPPA (92.4 vs. 75.1). The percent integral uniformity of the IP-SMS image (FIG. 9, section C) was 82.3%, which was higher than that of GRAPPA (77.6%), and met the American College of Radiology criterion for image uniformity at 3T.

3.2 In vivo Experiment

Figure 10:
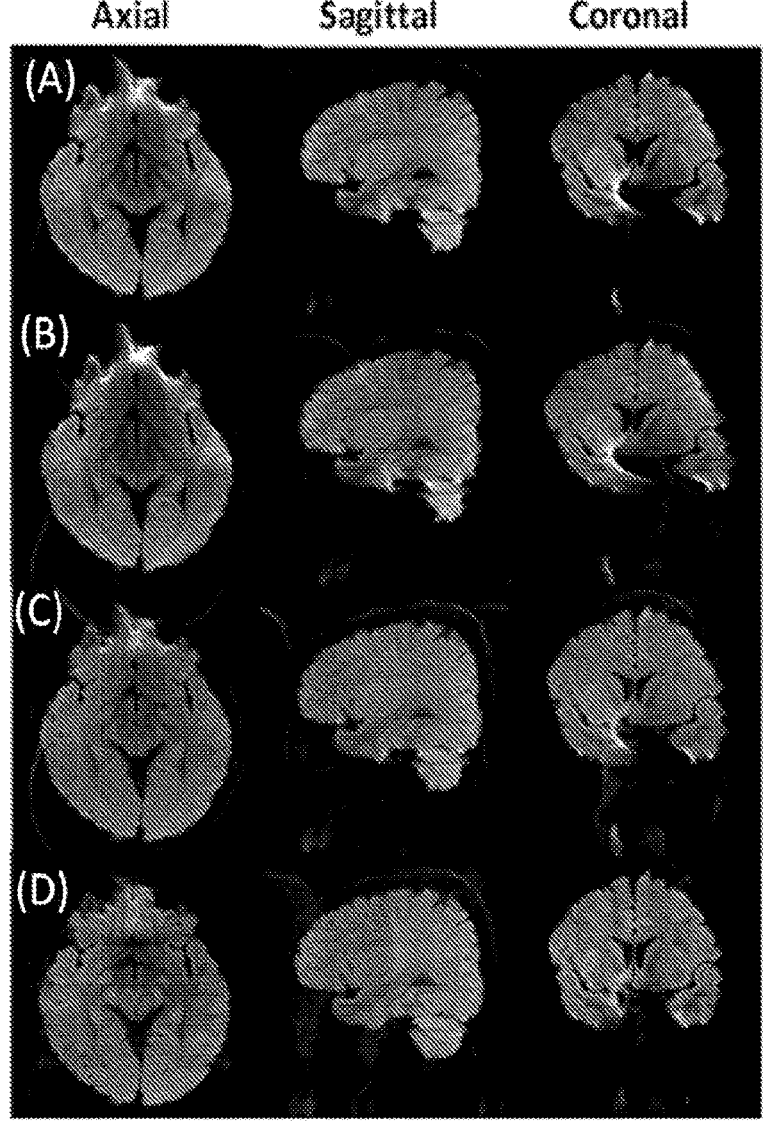
FIG. 10 shows diffusion-weighted brain images from a healthy human subject in the axial, sagittal, and coronal planes. Conventional diffusion-weighted images were acquired using a commercial single-shot EPI sequence at two in-plane spatial resolutions: $2 \times 2$ mm$^2$, shown in section A, and $1 \times 1$ mm$^2$, shown in section B. As the spatial resolution increased, the image distortion was exacerbated, particularly in the sagittal and coronal planes. Section C shows images using GRAPPA with an acceleration factor of 2 that demonstrated reduction in image distortion at high spatial resolution ($1 \times 1$ mm$^2$ in-plane). Section D shows the IP-SMS imaging allowed for a higher acceleration factor of 4 and produced high-spatial resolution ($1 \times 1$ mm$^2$ in-plane) with the least image distortion, particularly in the areas with large magnetic susceptibility variations, such as the frontal lobe, the temporal lobe, and the cerebellum.
Figure 11A:
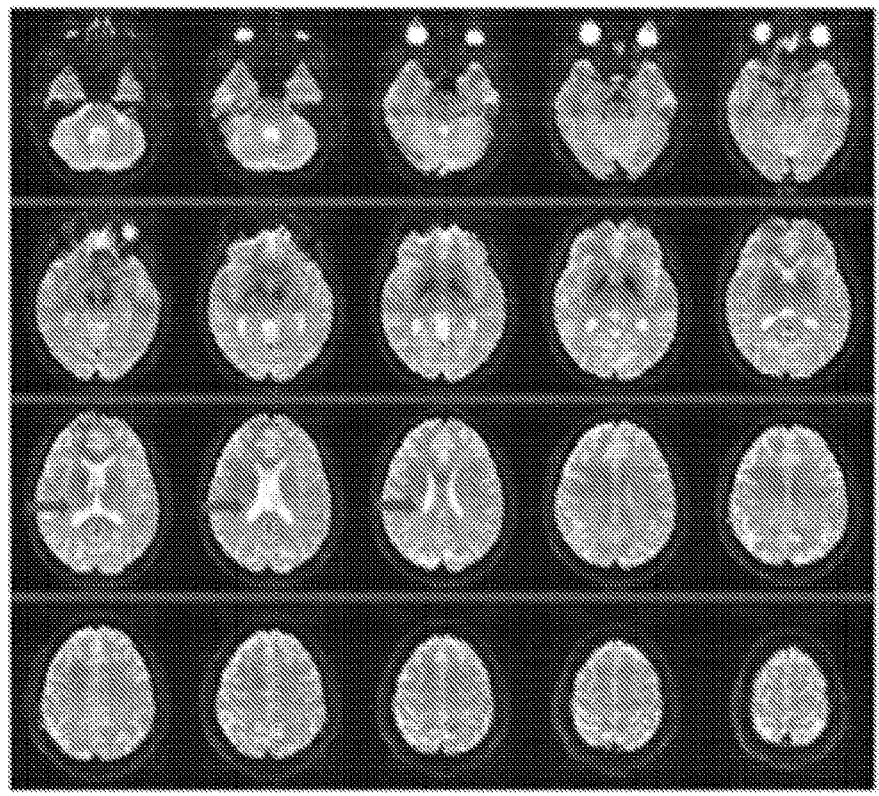
FIG. 11A shows twenty contiguous axial brain diffusion-weighted images (b-value=50 s/mm$^2$ acquired using IP-SMS from a healthy human subject. Arrows in the first three columns of the third row down indicate the CSF at the junction of adjacent segments.
Figure 11B:
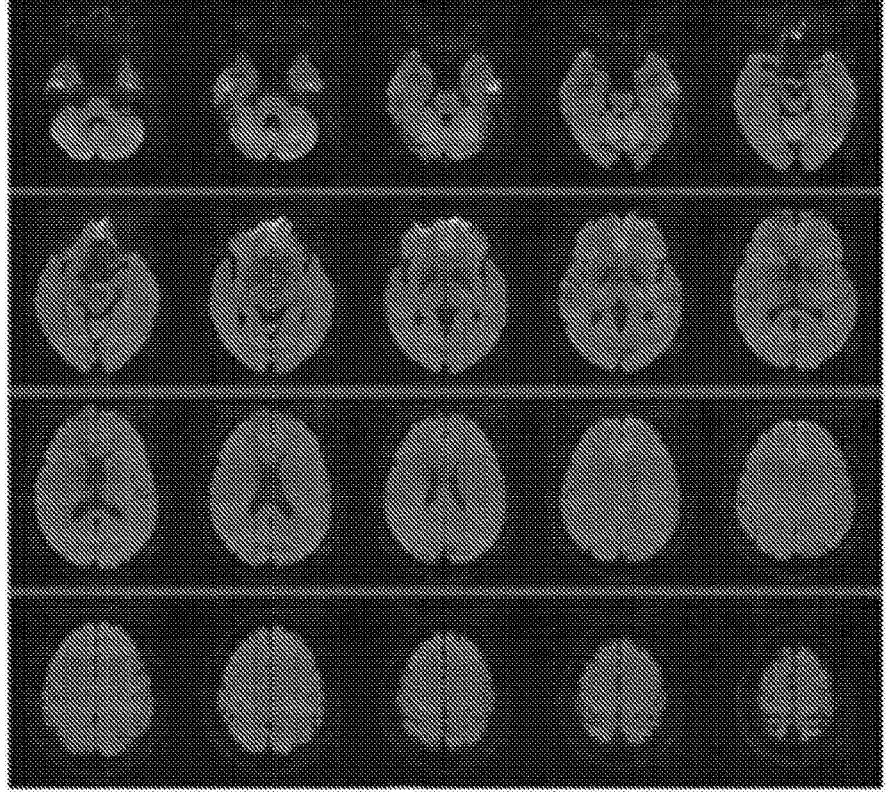
FIG. 11B shows twenty contiguous axial brain diffusion-weighted images (b-value=1000 s/mm$^2$) acquired using IP-SMS from a healthy human subject.

Human brain diffusion-weighted images from a healthy human subject (24-year-old male) are displayed in FIG. 10 in three orthogonal imaging planes (axial, sagittal, and coronal) with different acquisition schemes as explained in the caption. The IP-SMS with joint GRAPPA reconstruction using all 16 virtual coil sensitivity profiles enabled a higher acceleration factor of 4 and produced high-resolution images ($1\times1$ mm$^2$ in-plane) with the least image distortion. FIGS. 11A-B show a set of 20 slices with b-values of 50 s/mm$^2$ and 1000 s/mm$^2$ from another healthy volunteer (33-year-old male), illustrating the multi-slice compatibility of the IP-SMS technique. A total of 20 slices that covered the brain, again, exhibited high spatial resolution ($1\times1\times5$ mm$^3$) with only mild geometric distortion.

4. Discussion

An IP-SMS technique has been demonstrated in which multiple in-plane segments are simultaneously excited to accelerate acquisition of iSeg-EPI, thereby achieving a full-FOV coverage while having the benefits of rFOV imaging. Using the concept of virtual coils, a joint GRAPPA reconstruction method was also incorporated into IP-SMS and achieved high spatial resolution in DWI with reduced image distortion. It has been shown that rFOV is an important strategy to achieve high spatial resolution in diffusion or functional imaging while reducing geometric distortion.

iSeg-EPI extends these advantages to full-FOV imaging by combining several in-plane segments, each with an rFOV, that are acquired sequentially.

A major disadvantage of iSeg-EPI is the substantially increased scan times. The issue with the long scan times was elegantly addressed by Taviani et al using a technique in which a multiband in-plane excitation pattern was achieved by summing multiple 2D-RF pulses after a linear phase modulation on the individual sub-pulses. A subsequent 180° refocusing pulse was added to refocus the main excitation band and suppress unwanted side bands along the slice-selection direction. The reliance on a refocusing RF pulse can limit applications in which gradient-echo EPI is desirable (e.g., functional MRI with BOLD contrast).

In addition, the number of slices per TR can be limited due to signal saturations caused by the side bands. The IP-SMS technique described herein avoids these two problems. Although a refocusing pulse can be incorporated into IP-SMS as we demonstrated in the diffusion-weighted IP-SMS sequence, it is not mandatory. The IP-SMS sequence with the 2D-RF pulse alone is compatible with gradient-echo EPI for neurofunctional imaging or perfusion studies. More importantly, IP-SMS itself does not impose a limitation on the number of slices, because the side bands are positioned along the phase-encoded direction to enable simultaneous multi-segment FOV coverage, and hence no longer disruptive along the slice-selection direction. Compared with the segment-by-segment approach, IP-SMS considerably improves the efficiency.

As an in-plane multi-segment acquisition technique, IP-SMS resembles its through-plane counterpart: simultaneous multi-slice imaging. For example, both IP-SMS and simultaneous multi-slice techniques were proposed to shorten the scan times, and both rely on sensitivity profiles to separate the simultaneously acquired segments or slices. However, they also differ in a number of ways. First, conventional-simultaneous multi-slice is achieved by using a multiband RF pulse, which can lead to an increase in specific absorption rate. In contrast, a nominal 2D-RF pulse is used in IP-SMS without altering the specific absorption rate. Second, IP-SMS does not require multiple coil elements in the slice direction. As such, it is compatible with many existing multichannel coils, as demonstrated using a popular eight-channel head coil. Third, image-reconstruction algorithms for simultaneous multi-slice and IP-SMS are different. The GRAPPA reconstruction with CAIPIRINHA (controlled aliasing in parallel imaging results in higher acceleration) is often used in simultaneous multi-slice imaging, whereas a joint GRAPPA reconstruction using virtual coils has been used in IP-SMS to separate the aliased in-plane segments.

Parallel image reconstruction traditionally depends on physical coil sensitivity variations along the accelerated direction. Practical considerations such as SNR and residual aliasing often limit the acceleration factor. For example, the achievable acceleration factor is typically limited to two to three for an eight-channel coil. This limitation is relaxed in IP-SMS due to the use of virtual coils, which not only enabled a four-fold acceleration on an eight-channel coil, but also produced a more favorable SNR compared with conventional GRAPPA (FIG. 9). The SNR gain was likely due to a decreased g-factor (geometry factor) as a result of a clear spatial separation of the spatial profiles excited by the 2D-RF pulse. A rigorous SNR analysis would help substantiate this explanation in future studies. Additionally, using coils with a higher channel count (i.e., >8) will likely allow IP-SMS to achieve a higher acceleration factor (i.e., >4) than what can be achieved in conventional GRAPPA.

k-Space segmented imaging is a viable alternative technique to IP-SMS for reducing image distortion. This strategy, however, can be more sensitive to motion than IP-SMS due to phase errors in k-space. Although the shot-to-shot phase errors can be effectively managed by a growing number of techniques performing robust phase correction often involves additional data acquisitions. As a multi-shot image-domain segmented method, IP-SMS operates on the magnitude images, thus providing resilience to intershot k-space phase variations.

A limitation of IP-SMS is that it can introduce in-plane signal nonuniformity due to the imperfect RF pulse excitation profile. In the phantom study, slight discontinuity was observed at the segment boundaries. Even with this signal modulation, the percent integral uniformity satisfied the American College of Radiology image uniformity criterion at 3T. In the brain imaging study, such discontinuity was less evident. Another potential issue with IP-SMS is that the non-ideal RF excitation profile may cause signal saturation at the segment boundaries, particularly in tissues with long T1, such as the CSF. Such saturation, however, was not detected in this study (FIG. 11A-B; see the images of b-value=50 s/mm$^2$ where CSF is bright as indicated by the arrows). This was likely due to the fact that any potential saturation effect could be offset by the addition of two adjacent spatial profiles (note that we intentionally included 17% overlap between adjacent segments in our pulse sequence design). Finally, the in vivo imaging experiment was demonstrated only in the brain with diffusion weighting. Although substantial reduction in image distortion was illustrated, particularly for nonaxial DWI in which ssEPI has been limited due to off-resonance effects such as concomitant fields, extension to other organs and other contrasts remains to be explored.

V. Example 2-3D Reduced Field-of-View Imaging

1. Introduction

Echo planar imaging (EPI) has been widely used in functional magnetic resonance imaging (fMRI) and diffusion-weighted imaging (DWI). Its single-shot capability provides high temporal resolution and resiliency to subject motion. However, both gradient-echo EPI (GRE-EPI) and spin-echo EPI (SE-EPI) suffer from geometric distortion and spatial shifts (collectively called spatial dislocation thereafter) caused by various off-resonance effects, such as magnetic susceptibility variations, eddy currents, chemical shifts, concomitant magnetic fields, and bulk B0-field inhomogeneities. The amount of spatial dislocation $\Delta d$ is given by $$\Delta d = \frac{2\pi \Delta f}{BW \cdot \Delta k},$$

where $\Delta f$ is the amount of off-resonance in Hertz, $\Delta k$ is the k-space sampling interval, and BW is the sampling bandwidth. Along the phase-encoded direction, BW is inversely related to the inter-echo spacing ($T_{esp}$) of EPI and, thus, is substantially narrower (e.g., ~1 kHz) than the bandwidth along the readout direction, leading to exacerbated spatial dislocation.

To mitigate this problem, $\Delta k$ can be increased, as widely used in parallel imaging. Another approach is to reduce the field of view (FOV) along the phase-encoded direction using a 2D radiofrequency (RF) pulse, because $\Delta k$ is inversely proportional to FOV. Imaging with a reduced FOV (rFOV) can also produce a higher in-plane spatial resolution provided that the matrix size is retained. Because of these benefits, rFOV imaging has been increasingly used, particularly in DWI over a focal region, such as the brain stem. Presently, rFOV imaging has been limited to 2D multi-slice applications. Although several elegant methods have been developed to increase the robustness of 2D multi-slice rFOV imaging without being subject to the RF side-band perturbation, the 2D multi-slice approach has generic drawbacks including compromised slice profile and inferior through-plane spatial resolution that leads to highly anisotropic voxels. These issues can be effectively addressed in 3D imaging.

The goal of this work is to extend the benefits of rFOV imaging from 2D to 3D to overcome the limitations associated with 2D multi-slice rFOV imaging. We herein describe a 3D reduced field-of-view imaging (3D-rFOVI) method that uses a 2D RF pulse to excite a slab, followed by phase-encoding along the slab direction. The resulting 3D zoomed images with isotropic high spatial resolution and reduced geometric distortion are demonstrated in fMRI and DWI applications in the human brain.

2. Methods

The proposed 3D-rFOVI technique takes advantage of a 2D RF pulse to excite a slab along the conventional slice-selection direction (i.e., z-direction) while limiting the spatial extent along the phase-encoded direction (i.e., y-direction) within the slab. The slab is phase-encoded in both through-slab and in-slab phase-encoded directions. The 3D-rFOVI technique was implemented at 3T in gradient-echo and spin-echo EPI pulse sequences for functional MRI (fMRI) and diffusion-weighted imaging (DWI), respectively. 3D-rFOVI experiments were performed on a phantom and human brain to illustrate image distortion reduction, as well as isotropic high spatial resolution, in comparison with 3D full-FOV imaging.

2.1 3D-rFOVI

Unlike conventional 2D rFOV imaging where a 2D RF pulse is repetitively applied slice-by-slice, 3D-rFOVI uses a 2D RF pulse to excite a rFOV slab along the conventional slice-selection direction while limiting the spatial extent along the phase-encoded direction within the slab (FIG. 12, section A). Along the through-slab direction, a stepping phase-encoding gradient is applied to provide spatial encoding over a zoomed 3D volume. This approach can result in isotropic high spatial resolution while reducing off-resonance effects that cause image spatial dislocation and signal void. Following the 2D RF excitation and through-slab phase-encoding, an EPI readout is applied, forming a 3D-rFOV gradient-echo EPI (3D-rFOV GRE-EPI) sequence that can be used for fMRI. Alternatively, an optional slab-selective 180° refocusing pulse can be applied prior to the EPI readout, resulting in a 3D-rFOV spin-echo EPI (3D-rFOV SE-EPI) sequence. Further incorporation of a Stejskal-Tanner gradient enables the 3D-rFOV SE-EPI sequence for DWI applications.

2.2 RF Pulse and Pulse Sequence Design

A 2D RF pulse was designed by using a fly-back EPI-like excitation k-space trajectory to avoid Nyquist ghosts. Discrete sampling of excitation k-space along the blipped gradient direction resulted in periodic replicates (or side bands) of the excitation profile (or main band). The separation between the main band and the first side band ($\Delta S$) is the inverse of the excitation k-space sampling interval ($\Delta k_e$), which can be expressed as:

$$\Delta S = \frac{1}{\Delta k_e} = \frac{(N-1) \cdot \Delta S_{PE}}{T_{PE} \cdot BW_{PE}}$$

where N is the number of sub-pulses, $\Delta S_{PE}$ is the width of excitation band along the phase-encoded direction (i.e., y-direction), and $T_{PE}$ and $BW_{PE}$ are the duration and bandwidth of the envelope RF pulse, respectively. In our design, the main band was used to excite a limited 3D region of interest, while the side bands were positioned outside the imaged object by using 11 sub-pulses each with a time-bandwidth product (TBP) of 3.01. The amplitude of these sub-pulses was modulated by an envelope RF pulse whose TBP was 3.53 and pulse width was 14.7 ms (FIG. 12, section C). With these parameters, $\Delta S$ was approximately $2.8 \times \Delta S^{PE}$. Both the sub-pulses and the envelope pulse were designed using a Shinnar-Le-Roux algorithm with a linear phase and projected ripples of 1% in and out of the slab. The EPI bipolar gradient wave-form (i.e., $G_z$ gradient in FIG. 12, section C) concurrent with the 2D RF pulse was designed by minimizing the duration (0.24 ms) of the even (or fly-back) gradient lobes using a triangular waveform. The duration (1.13 ms) of the odd gradient lobes was stretched to take advantage of the time saved by compressing the even gradient lobes. The corresponding RF pulses were also stretched in pulse width accordingly while their amplitudes reduced. Following the 2D RF pulse, a phase-encoding gradient was applied in the slab-selective direction to achieve 3D spatial encoding. The 2D RF pulse with 3D spatial encoding was incorporated into a $T^{+}_{2}$-weighted GRE-EPI and a diffusion-weighted SE-EPI pulse sequence for experimental demonstrations. Fat suppression was achieved by a frequency-selective saturation pulse prior to the 2D RF pulse.

2.3 Experiments

The $T^{+}_{2}$-weighted GRE-EPI and diffusion-weighted SE-EPI sequences based on 3D-rFOVI were implemented on a GE MR750 3T scanner (GE Healthcare, Waukesha, Wisconsin, USA). Phantom and human in vivo experiments were performed to demonstrate the proposed 3D-rFOVI technique. The human scans were conducted on healthy volunteers with approval from the Institutional Review Board (IRB) and written informed consent from the subjects.

In the first experiment, an American College of Radiology (ACR) phantom was used to validate the pulse sequence and its associated 3D image reconstruction. Phantom images from the 3D-rFOV GRE-EPI sequence were acquired with the following parameters: TR/TE=100/30 ms, volume TR ($TR_{vol}$)=2000 ms (where the $TR_{vol}$ is defined as the time taken to acquire a 3D volume), flip angle=30°, FOV=256×128 mm², slab thickness=40 mm, acquisition matrix=128×64×20, and isotropic spatial resolution=2.0×2.0×2.0 mm³. The corresponding conventional full-FOV 3D EPI images (FOV=256×256×40 mm³, acquisition matrix=128×128×20) were also acquired for comparison. To establish a reference to assess spatial dislocations, additional images were obtained using a conventional 3D fast SPGR sequence (TR/TE=5.1/1.8 ms, flip angle=10°, FOV=256×256×40 mm³, and acquisition matrix=128×128×20). To quantify the geometric distortion, a horizontal line in the SPGR image (arrows in FIG. 13) was chosen as a reference, and the spatial shift between the end and the midpoint of the line along the phase-encoded direction was calculated and compared between the full-FOV and rFOV GRE-EPI images.

In the second experiment, human brain was imaged using a 32-channel head coil (Nova Medical, Inc, Wilmington, Massachusetts, USA) with the same protocol described above. Geometric distortion and image signal-to-noise ratio (SNR) in the visual cortex area were compared between the full-FOV and rFOV GRE-EPI brain images. The SNR was calculated by using signal intensity in the occipital lobe divided by the average of background standard deviations over four regions (each with an area of about 200 mm²) selected at the corners of the image to avoid residual ghosting artifacts.

The third experiment aimed at demonstrating the 3D-rFOV GRE-EPI sequence for fMRI with visual stimulation. The imaging parameters were: TR/TE=100/30 ms, $TR_{vol}$=2000 ms, number of volumes=120, flip angle=30°, FOV=200×100 mm², slab thickness=40 mm, acquisition matrix=100×50×20, and isotropic spatial resolution=2.0×2.0×2.0 mm³. Visual stimulation was delivered using a commercial system (SensaVue, Invivo Corporation, Gainesville, Florida, USA) with a dark-gray and light-gray checkboard pattern flashing at 8 Hz. The block-design paradigm contained five 48 s blocks, each with a 24 s rest period and a 24 s stimulation. The total acquisition time was 4 minutes. A healthy human subject (32-y-old male) was asked to fixate on the cross-hair presented at the center of visual field during the experiment. All data were analyzed using SPM8 on MATLAB 2012b (The MathWorks, Inc, Natick, Massachusetts, USA). Motion correction and spatial smooth (full-width half-maximum [FWHM]=6 mm) were applied to magnitude images, followed by statistical analyses using a general linear model for activation detection with a p-value threshold (family-wise error [FWE] corrected) of <0.05.

In the fourth experiment, 3D zoomed diffusion-weighted brain images were acquired from the mid-brain region of healthy human subjects using a 3D-rFOV SE-EPI sequence. The key acquisition parameters were: TR/TE=4000/72 ms, FOV=160×80 mm², slab thickness=40 mm, matrix size=160×80×40, isotropic spatial resolution=1×1×1 mm³, diffusion gradient direction=anterior-posterior, $b_{NEX}=0_1$ and $1000_3$ s/mm² (where the subscripts indicate the number of averages), and scan time=10 min and 44 s. Maps of apparent diffusion coefficient (ADC) were obtained from the images acquired at the two b-values using custom software in MATLAB with a mono-exponential model. Regions of interest (ROIs) were drawn bilaterally at the frontotemporal area and corona radiata to calculate the average ADC values in the gray and white matters, respectively.

3. Results 3.1 Phantom Results

Figure 13:
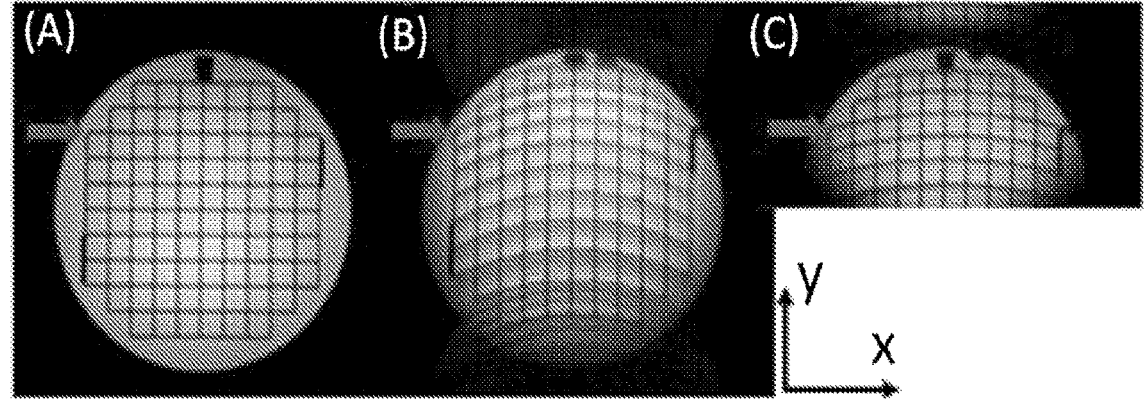
FIG. 13 shows representative images of a slice selected from 3D datasets of the American College of Radiology (ACR) phantom acquired using three different sequences: a 3D SPGR sequence shown in section A, a 3D GRE-EPI sequence with a full FOV shown in section B, and the 3D-rFOVI sequence with GRE-EPI shown in section C demonstrated in FIG. 13. Compared to the reference image in section A, the image in section B exhibited excessive image distortion. In contrast, image distortion was substantially reduced in section C. The distances along the phase-encoded direction (i.e., y-direction) between the end and the midpoint of the third horizontal line (arrows) were eight pixels in section B and four pixels in section C. The aliasing artifact at the top of section C was caused by a slight mismatch between the prescribed rFOV and the 2D RF excitation profile.

FIG. 13 displays images from the first experiment, including the results from the conventional 3D SPGR sequence (FIG. 13, section A), the 3D EPI sequence with a full FOV (FIG. 13, section B), and the 3D-rFOVI sequence (FIG. 13, section C). For each sequence, a representative image corresponding to slice No. 5 of the ACR phantom was selected from the 3D volumetric dataset. The spatial dislocation was measured by the shift along the vertical phase-encoded direction between the end and the midpoint of the third horizonal reference line, as indicated by the red arrows in FIG. 13. Compared with the 3D SPGR reference image (FIG. 13, section A), the spatial dislocation was eight and four pixels in the full-FOV (FIG. 13, section B) and rFOV GRE-EPI images (FIG. 13, section C), respectively. In general, the 3D-rFOV GRE-EPI image exhibited much less geometric distortion than the 3D full-FOV GRE-EPI image when the conventional SPGR image was used as a reference.

3.2 Human Imaging Results

Figure 16:
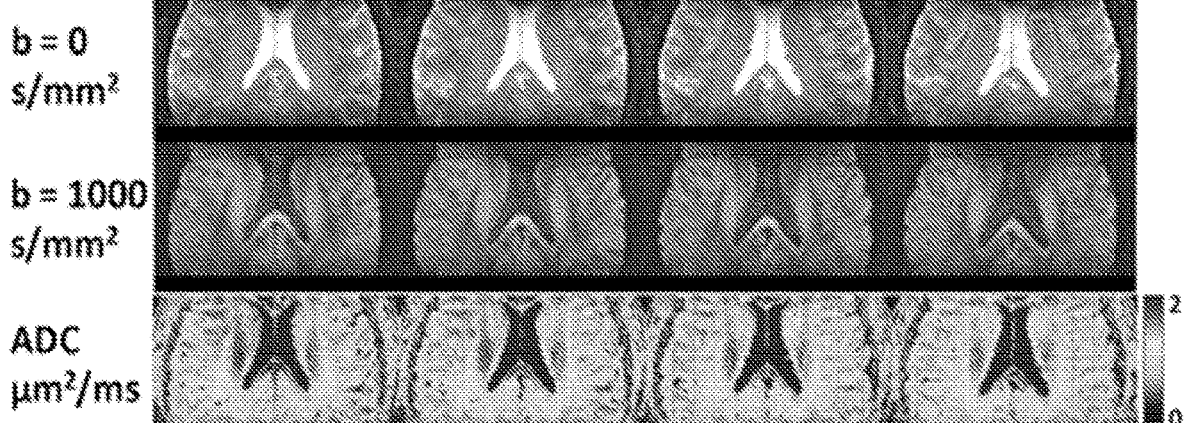
FIG. 16 shows representative T2-(1st row) and diffusion-weighted (2nd row) 3D brain images acquired using 3D-rFOV SE-EPI on a healthy human brain (25-y-old male), together with the corresponding ADC maps (3rd row). Using 3D-rFOVI, three-dimensional isotropic high spatial resolution ($1 \times 1 \times 1$ mm$^3$) was achieved without appreciable image distortion. Bilateral ROIs were drawn at the frontotemporal area (center) and corona radiata (radiating from the center) to calculate the average ADC values of representative gray and white matters, respectively. The corresponding ADC values were $0.96 \pm 0.12$ μm$^2$/ms for the gray matter and $0.85 \pm 0.21$ μm$^2$/ms for the white matter.

Representative 3D-rFOV GRE-EPI images ($2\times2\times2$ mm$^3$ isotropic voxel size) selected from a 3D volume of the human brain (second experiment) are shown in FIG. 14. Reduced geometric distortion was observed in the 3D rFOV images when compared with 3D full-FOV images. Quantitative measurement of SNR in the region of visual cortex revealed an approximately 30% reduction in the 3D rFOV image (SNR=81.5) compared with the 3D full-FOV image (SNR=117.6). Results from the third experiment on fMRI are displayed in FIG. 15A where eight contiguous activation maps from the 3D-rFOV GRE-EPI acquisition are overlaid on the corresponding baseline images. fMRI activations were observed in the visual cortex, as expected. The time evolution of BOLD signal change (approximately 2.5%, obtained from the average signal) in the activated visual cortex area is illustrated in FIG. 15B. FIG. 16 shows a set of 3D zoomed diffusion-weighted brain images acquired with the 3D-rFOV SE-EPI sequence. Three-dimensional diffusion-weighted images with isotropic high spatial resolution ($1\times1\times1$ mm$^3$) was achieved without appreciable image distortion. The ADC maps calculated from the images with two b-values (bottom row in FIG. 16) revealed average ADC values of $0.96\pm0.12$ $\mu m^2/ms$ and $0.85\pm0.21$ $\mu m^2/ms$ in the representative gray (frontotemporal area) and white (corona radiata) matters, respectively, which are consistent with the literature values (gray matter: 0.78-1.09 $\mu m^2/ms^{14}$; white matter: 0.60-1.05 $\mu m^2/ms^{15}$).

4. Discussions

Our study demonstrated a 3D-rFOVI technique, which enabled focused 3D imaging in a larger object. By combining the slab-selective capability of a 2D RF pulse with 3D spatial encoding, 3D-rFOVI achieved isotropic high spatial resolution and reduced geometric distortion in phantom and human brain images with specific demonstrations for anatomic imaging, fMRI, and DWI applications.

It has been shown that reducing FOV is an effective strategy to achieve high spatial resolution and mitigate geometric distortion. This approach has been well demonstrated in an increasing number of applications using 2D multi-slice imaging. However, achieving 3D isotropic resolution remains challenging as the 2D RF pulses used in 2D rFOV imaging typically produce a much lower spatial resolution through-plane than in-plane, often due to the constraints of the RF pulse and the gradient. By using 2D slab-excitation (i.e., intentionally making the through-plane resolution worse) followed by through-plane phase encoding, we have overcome this limitation and achieved 3D isotropic spatial resolution. Because a thin slice is no longer pursued in the 2D RF pulse design for 3D rFOVI, the pulse width of the sub-pulses, gradient slew rate, and gradient amplitude are all relaxed. The shortened RF pulse, for example, provided more flexibility in selecting TE for fMRI studies and minimizing TE for DWI.

Similar to conventional 2D rFOV imaging, 3D-rFOVI also relies on a 2D RF pulse, and as such is subject to periodic side-band excitations arising from discrete sampling. In accordance with the properties of Fourier transform, the separation between the bands is inversely related to the separation of two adjacent excitation k-space lines ($\Delta k_e$). In the fMRI and DWI experiments, $\Delta k_e$ was designed to be 0.0035 and 0.0044 mm$^{-1}$, respectively, which positioned the closest side bands more than 200 mm away along the phase-encoded direction. This design effectively avoided perturbations from the side bands.

3D rFOVI can be achieved using alternative techniques. For example, parallel transmit is a viable approach to 3D inner-volume excitation while maintaining a short duration of multidimensional RF pulses. This method, however, requires expensive hardware and sophisticated RF pulse design strategies that are not commonly available on clinical 3T and 1.5T scanners. A 3D zoomed volume can also be isolated using three RF pulses such as a 90°-180°-180° or 90°-90°-90° pulse train, followed by phase-encoding. Each of these RF pulses in the pulse train is applied with a gradient along an orthogonal spatial direction, selecting a 3D zoomed volume at the intersection. In spin-echo sequences, the number of required RF pulses can be reduced to two for 3D rFOVI because zooming in the readout direction can be accomplished using anti-aliasing filtering. In comparison with the proposed 3D-rFOVI technique, the approach with orthogonal profiles is not subject to periodic side bands arising from discrete excitation k-space sampling, which can be advantageous. However, this approach perturbs spins outside the selected intersection, limiting subsequent selections in other regions when multiple 3D zoomed volumes are desired, such as in 3D multi-slab imaging. In addition, the reliance on two or more RF pulses makes the method incompatible with GRE-EPI for neuro-functional imaging. Another approach of achieving 3D rFOVI is outer-volume suppression (OVS). This technique requires lengthy pre-saturation pulses and is typically subject to imperfect suppression caused by B$_0$ inhomogeneities and/or B1 non-uniformity. Incomplete signal suppression from the outer volume can lead to aliasing artifacts, interfering with the signals from the focused region of interest. The 3D-rFOVI approach used in this study avoids the aforementioned problems.

The fly-back EPI-like excitation k-space trajectory used in our 2D RF pulse design provides robustness against gradient infidelities (particularly those caused by eddy currents) than bidirectional EPI-like gradient waveform. In addition, the fly-back k-space trajectory allows ID RF pulses (sub-pulses and their envelope RF pulse) to be designed separately, which provides independent control of two out of the three dimensions of the excited volume compared with a spiral trajectory. A major drawback is that the fly-back EPI-like excitation k-space trajectory can lead to an increased duration of the 2D RF pulse, lengthening the minimum TE and TR. Other 2D RF pulse design strategies also exist, such as those using a discretized matrix. The alternative 2D RF design methods should be investigated in future studies.

The benefits of using 3D-rFOVI are expected to be greater at a higher magnetic field where the need for image distortion reduction is more prominent due to the increased off-resonance effects and where the improved SNR can better support high isotropic spatial resolution. In principle, the former issue can also be mitigated by incorporating parallel imaging. However, the limited RF coil sensitivity variation over a reduced FOV will likely make parallel imaging reconstruction very challenging. Other methods to reduce image distortion have also been reported, including magnetization preparation followed by segmented SPGR readout (instead of EPI). The latter issue is particularly important for 3D-rFOVI because of an intrinsic loss in SNR as a result of the reduced sampling in k-space as well as a smaller voxel size. As shown in the second experiment, the SNR in the 3D-rFOV GRE-EPI images was reduced by about 30% compared to 3D full-FOV GRE-EPI images. This SNR reduction was consistent with the fact that only one half of k-space data were acquired in the 3D-rFOV scan as compared to those in the full FOV acquisition. (Theoretically, the SNR is reduced by $$\left(1 - \frac{1}{\sqrt{2}}\right) \times 100\%,$$

or about 29%, which is consistent with experimental observations.) At 3T, the decreased SNR in 3D-rFOVI may require more signal averaging, as we showed in the DWI experiments. In addition, the SNR can be reduced further when a small flip angle is used in the 3D-rFOV GRE-EPI sequences to avoid signal saturation in the fMRI experiments. The analysis showed that up to 25% reduction in SNR could occur when compared to the scenario of using a 90° Flip angle. To improve SNR efficiency and increase spatial coverage, a 3D multi-slab technique (a hybrid between 2D and 3D imaging), may be incorporated into 3D-rFOVI in future studies. Another limitation of the study is that the FOV reduction was demonstrated only along the phase-encoded and slab-selection directions. Limiting the FOV along the readout direction can be readily achieved by taking advantage of the anti-aliasing filters that are widely implemented on commercial MRI scanners.

The description of different advantageous arrangements has been presented for purposes of illustration and description and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

The invention claimed is:

1. A method for using an MRI system electrically coupled to a computing device, the method comprising:
generating (i) a plurality of integrated multi-band excitation two-dimensional ("2D") radiofrequency ("RF") pulses comprising a first 2D RF excitation pulse and a second 2D RF excitation pulse and (ii) a plurality of accompanying magnetic field gradients having a plurality of physical gradient axes, and thereby simultaneously exciting a plurality of segments within a first imaging slice, wherein each of the plurality of segments cover a restricted or reduced field-of-view ("rFOV") within the first imaging slice;
generating a first set of parallel segments from the plurality of segments in the first slice selected by the first 2D RF excitation pulse, such that adjacent segments in the first set of parallel segments are each spatially separated by a gap, wherein the first set of parallel segments comprise imaging data; and
generating a second set of parallel segments from the plurality of segments in the first slice selected by the second 2D RF excitation pulse, such that adjacent segments in the second set of parallel segments are each spatially separated by a gap, wherein the second set of parallel segments comprise imaging data, wherein the second set of parallel segments spatially interleave within the gaps of the first set of parallel segments thereby resulting in a complete spatial coverage of the first imaging slice.

2. The method of claim 1, further comprising:
reconstructing an image of a portion of or a full field-of-view ("FOV") of the first imaging slice, via the computing device, based on the imaging data of the first set of parallel segments and the imaging data of the second set of parallel segments.

3. The method of claim 2, wherein the MRI system has a plurality of physical receiving RF coils and a plurality of virtual coils, the method further comprising:
determining a plurality of sensitivity profiles that correspond to each of the plurality of physical receiving RF coils and the plurality of virtual coils;
determining the gaps for spatial separation in the first set of parallel segments and in the second set of parallel segments based on a 2D RF pulse design; and
wherein reconstructing an image of a full field-of-view ("FOV") of the first imaging slice is further based on the plurality of virtual coil sensitivity profiles comprising the physical receiving RF coil sensitivity profiles and computed 2D RF excitation profiles that act as a weighting function.

4. The method of claim 3, further comprising:
determining a total number of virtual coils based on a total number of the physical coils multiplied by a total number of the plurality of integrated multi-band excitation 2D radiofrequency (RF) pulses; and
forming the virtual coils based on a combination of the plurality of sensitivity profiles that correspond to each of the plurality of physical receiving RF coils and a plurality of 2D RF pulse spatial profiles for each of the plurality of integrated multi-band excitation 2D radiofrequency (RF) pulses.

5. The method of claim 3, further comprising:
applying a gradient Gy during the second RF excitation pulse and thereby modulating a frequency of the second RF excitation pulse and shifting a 2D excitation profile along a phase-encoded direction.

6. The method of claim 1, further comprising:
producing an excitation k-space trajectory, via the plurality of the accompanying magnetic field gradients, using a bipolar or a fly-back echo planar trajectory design.

7. The method of claim 1, further comprising:
producing an excitation k-space trajectory, via the plurality of the accompanying magnetic field gradients, using a tilted excitation k-space design for multi-slice imaging.

8. The method of claim 1, further comprising:
spatially encoding the first set of parallel segments and the second set of parallel segments using an echo planar imaging method.

9. The method of claim 1, wherein a width of the gaps that spatially separate the adjacent segments in the first set of parallel segments and the second set of parallel segments ranges from 60% to 90% of a width of each of the segments in the first set of parallel segments and the second set of parallel segments.

10. The method of claim 1, wherein an overlap between the second set of parallel and the first set of parallel segments, when they are interleaved, ranges from 15% to 25% of a width of each of the segments in the first set of parallel segments and the second set of parallel segments.

11. A non-transitory computer-readable medium having stored thereon program instructions that upon execution by a processor, cause performance of a set of steps comprising:

an MRI system generating a plurality of integrated multi-band excitation two-dimensional ("2D") radiofrequency ("RF") pulses comprising a first 2D RF excitation pulse and a second 2D RF excitation pulse, together with a plurality of accompanying magnetic field gradients having a plurality of physical gradient axes, thereby simultaneously exciting a plurality of segments within a first imaging slice, wherein each of the plurality of segments cover a restricted or reduced field-of-view ("rFOV") within the first imaging slice;

the MRI system generating a first set of parallel segments from the plurality of segments in the first slice selected by the first 2D RF excitation pulse, such that adjacent segments in the first set of parallel segments are each spatially separated by a gap, wherein the first set of parallel segments comprise imaging data; and the MRI system generating a second set of parallel segments from the plurality of segments in the first slice selected by the second 2D RF excitation pulse, such that adjacent segments in the second set of parallel segments are each spatially separated by a gap, wherein the second set of parallel segments comprise imaging data, wherein the second set of parallel segments spatially interleave within the gaps of the first set of parallel segments thereby resulting in a complete spatial coverage of the first imaging slice.

12. A method for using an MRI system electrically coupled to a computing device, the method comprising:

targeting at least one zoomed three-dimensional ("3D") volume within an object; and generating (i) a two-dimensional ("2D") excitation radiofrequency ("RF") pulse, (ii) a first magnetic field gradient in a first dimension and a second magnetic field gradient in a second dimension, and thereby exciting a first slab along the first dimension having a restricted field-of-view ("rFOV") along the second dimension in a slab plane, and (iii) a third magnetic field gradient that is arranged along the first dimension perpendicular or normal to the slab plane, and thereby phase-encoding an MRI signal emitted from the first slab, via the third magnetic field gradient, to provide spatial encoding in a through-slab direction.

13. The method of claim 12, further comprising:

reconstructing, via the computing device, the phase-encoded MRI signal to form a 3D image for the first slab.

14. The method of claim 12, further comprising:

exciting a plurality of parallel slabs, including the first slab, via the first magnetic field gradient and the second magnetic field gradient, wherein the plurality of parallel slabs are arranged along the through-slab direction;

phase-encoding an MRI signal emitted from each the plurality of parallel slabs, including the first slab, via the third magnetic field gradient; and reconstructing, via the computing device, the phase-encoded MRI signal to form a 3D image for the plurality of parallel slabs.

15. The method of claim 12, further comprising:

producing an excitation k-space trajectory, via the first magnetic field gradient and the second magnetic field gradient, using a tilted excitation k-space design; and generating a set of tilted slabs comprising a main slab and a plurality of side slabs.

16. The method of claim 15, further comprising:

phase-encoding an MRI signal emitted from at least one of the main slab and the plurality of side slabs, via the third magnetic field gradient, in the through-slab direction.

17. The method of claim 12, further comprising generating a plurality of subsequent 2D excitation RF pulses;

exciting a plurality of sets of tilted slabs, each covering an imaged object in areas that have not been excited by previous 2D excitation RF pulses;

phase-encoding an MRI signal emitted from each slab of the plurality of sets of tilted slabs, via the third magnetic field gradient; and individually reconstructing, via the computing device, the phase-encoded MRI signal from each slab of the plurality of sets of tilted slabs to form individual 3D images for each slab of the plurality of sets of tilted slabs.

18. The method of claim 17, further comprising:

combining, via the computing device, the 3D images from the individual reconstructed slabs to form a 3D image with a reduced or a full FOV.

19. The method of claim 12, wherein the first slab is spatially encoded in the slab plane using an echo planar imaging method.

* * * * *